(12) United States Patent
Baraskar et al.

(10) Patent No.: US 10,115,730 B1
(45) Date of Patent: Oct. 30, 2018

(54) THREE-DIMENSIONAL MEMORY DEVICE CONTAINING STRUCTURALLY REINFORCED PEDESTAL CHANNEL PORTIONS AND METHOD OF MAKING THEREOF

(71) Applicant: SANDISK TECHNOLOGIES LLC, Plano, TX (US)

(72) Inventors: Ashish Baraskar, Santa Clara, CA (US); Naohiro Hosoda, Yokkaichi (JP); Yanli Zhang, San Jose, CA (US); Raghuveer S. Makala, Campbell, CA (US); Hiroyuki Tanaka, Yokkaichi (JP); Ryo Nakamura, Yokkaichi (JP); Tadashi Nakamura, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/626,766

(22) Filed: Jun. 19, 2017

(51) Int. Cl.
| | |
|---|---|
| *H01L 27/115* | (2017.01) |
| *H01L 27/11556* | (2017.01) |
| *H01L 27/11582* | (2017.01) |
| *H01L 27/11524* | (2017.01) |
| *H01L 27/1157* | (2017.01) |
| *H01L 21/265* | (2006.01) |

(52) U.S. Cl.
CPC .. *H01L 27/11556* (2013.01); *H01L 21/26513* (2013.01); *H01L 27/1157* (2013.01); *H01L 27/11524* (2013.01); *H01L 27/11582* (2013.01)

(58) Field of Classification Search
CPC ......... H01L 27/11556; H01L 21/26513; H01L 27/1157; H01L 27/11582; H01L 27/11524
See application file for complete search history.

(56) References Cited

U.S. PATENT DOCUMENTS

| | | |
|---|---|---|
| 5,915,167 A | 6/1999 | Leedy |
| 8,680,604 B2 | 3/2014 | Higashi et al. |
| 9,023,719 B2 | 5/2015 | Pachamuthu et al. |
| 9,035,372 B2 | 5/2015 | Song |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Selim Ahmed
(74) *Attorney, Agent, or Firm* — The Marybury Law Group PLLC

(57) ABSTRACT

A three-dimensional memory device includes an alternating stack of insulating layers and electrically conductive layers located over a semiconductor surface, a memory opening extending through the alternating stack, a semiconductor pedestal channel portion located at a bottom portion of the memory opening and contacting a top surface of the semiconductor surface, and a memory stack structure located in the memory opening and contacting a top surface of the pedestal channel portion. The memory stack structure includes a memory film and a vertical semiconductor channel located inside the memory film. A maximum lateral extent of the pedestal channel portion is greater than a maximum lateral dimension of an entire interface between the pedestal channel portion and the memory stack structure.

18 Claims, 35 Drawing Sheets

(56) References Cited

U.S. PATENT DOCUMENTS

| | | |
|---|---|---|
| 9,230,973 B2 | 1/2016 | Pachamuthu et al. |
| 9,230,979 B1 | 1/2016 | Pachamuthu et al. |
| 9,230,980 B2 | 1/2016 | Rabkin et al. |
| 9,230,987 B2 | 1/2016 | Pachamuthu et al. |
| 9,246,088 B2 | 1/2016 | Yamamoto et al. |
| 9,356,043 B1 | 5/2016 | Sakakibara et al. |
| 9,455,263 B2 | 9/2016 | Zhang et al. |
| 9,478,558 B2 | 10/2016 | Koka et al. |
| 9,484,357 B2 | 11/2016 | Makala et al. |
| 9,524,976 B2 | 12/2016 | Pachamuthu et al. |
| 9,576,967 B1 | 2/2017 | Kimura et al. |
| 9,659,956 B1 | 5/2017 | Pachamuthu et al. |
| 2006/0102586 A1 | 5/2006 | Lee et al. |
| 2007/0252201 A1 | 11/2007 | Kito et al. |
| 2012/0199897 A1 | 8/2012 | Chang et al. |
| 2013/0161821 A1 | 6/2013 | Hwang et al. |
| 2014/0054676 A1 | 2/2014 | Nam et al. |
| 2014/0198553 A1 | 7/2014 | Lung |
| 2014/0284691 A1 | 9/2014 | Takamura et al. |
| 2015/0104916 A1 | 4/2015 | Lee et al. |
| 2015/0115348 A1 | 4/2015 | Nam et al. |
| 2015/0179660 A1 | 6/2015 | Yada et al. |
| 2015/0294978 A1 | 10/2015 | Lu et al. |
| 2015/0348984 A1 | 12/2015 | Yada et al. |
| 2016/0056169 A1 | 2/2016 | Lee et al. |
| 2016/0099289 A1 | 4/2016 | Yamato et al. |
| 2016/0111432 A1 | 4/2016 | Rabkin et al. |
| 2016/0141294 A1 | 5/2016 | Peri et al. |
| 2016/0172366 A1* | 6/2016 | Koka ............... H01L 29/7883 257/314 |
| 2016/0268209 A1 | 9/2016 | Pachamuthu et al. |
| 2016/0329101 A1 | 11/2016 | Sakakibara |
| 2016/0329343 A1 | 11/2016 | Pachamuthu et al. |
| 2016/0379989 A1 | 12/2016 | Sharangpani et al. |
| 2017/0125437 A1 | 5/2017 | Pachamuthu et al. |
| 2017/0125438 A1 | 5/2017 | Pachamuthu et al. |

OTHER PUBLICATIONS

Wong et al., "Wafer Temperature Dependence of the Vapor-Phase HF Oxide Etch," J. Electrochem., Soc., vol. 140, No. 1, pp. 205-208 (1993).

H. Seidel, J. Electrochem. Soc., vol. 137, No. 11 (1990), "Anisotropic Etching of Crystalline Silicon in Alkaline Solutions".

U.S. Appl. No. 15/071,575, filed Mar. 16, 2016, Sandisk Technologies LLC.

U.S. Appl. No. 15/183,195, filed Jun. 15, 2016, Sandisk Technologies LLC.

U.S. Appl. No. 15/186,768, filed Jun. 20, 2016, Sandisk Technologies LLC.

U.S. Appl. No. 15/226,132, filed Aug. 2, 2016, Sandisk Technologies LLC.

U.S. Appl. No. 15/296,380, filed Oct. 18, 2016, Sandisk Technologies LLC.

U.S. Appl. No. 15/347,101, filed Nov. 9, 2016, Sandisk Technologies LLC.

U.S. Appl. No. 15/401,426, filed Jan. 9, 2017, Sandisk Technologies LLC.

* cited by examiner

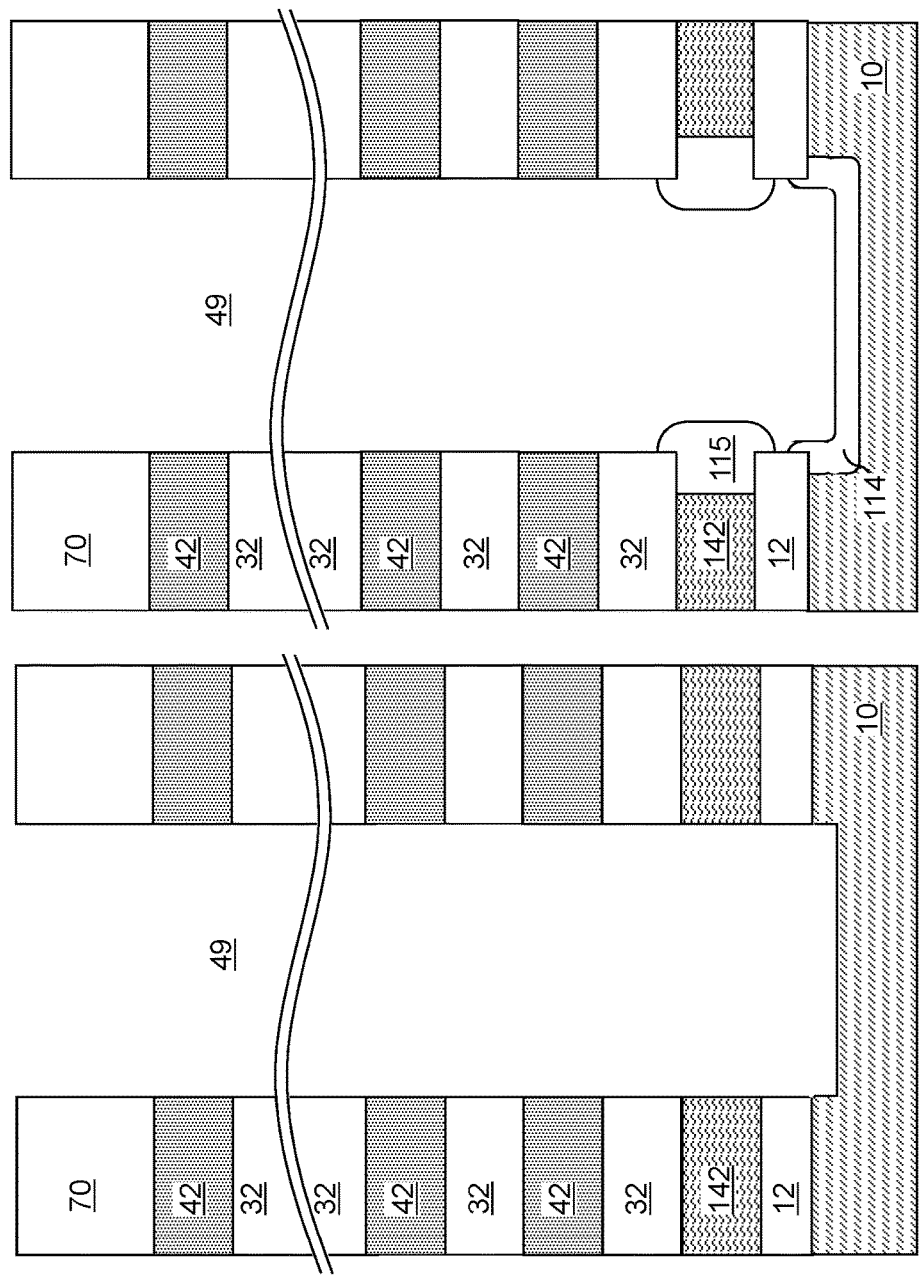

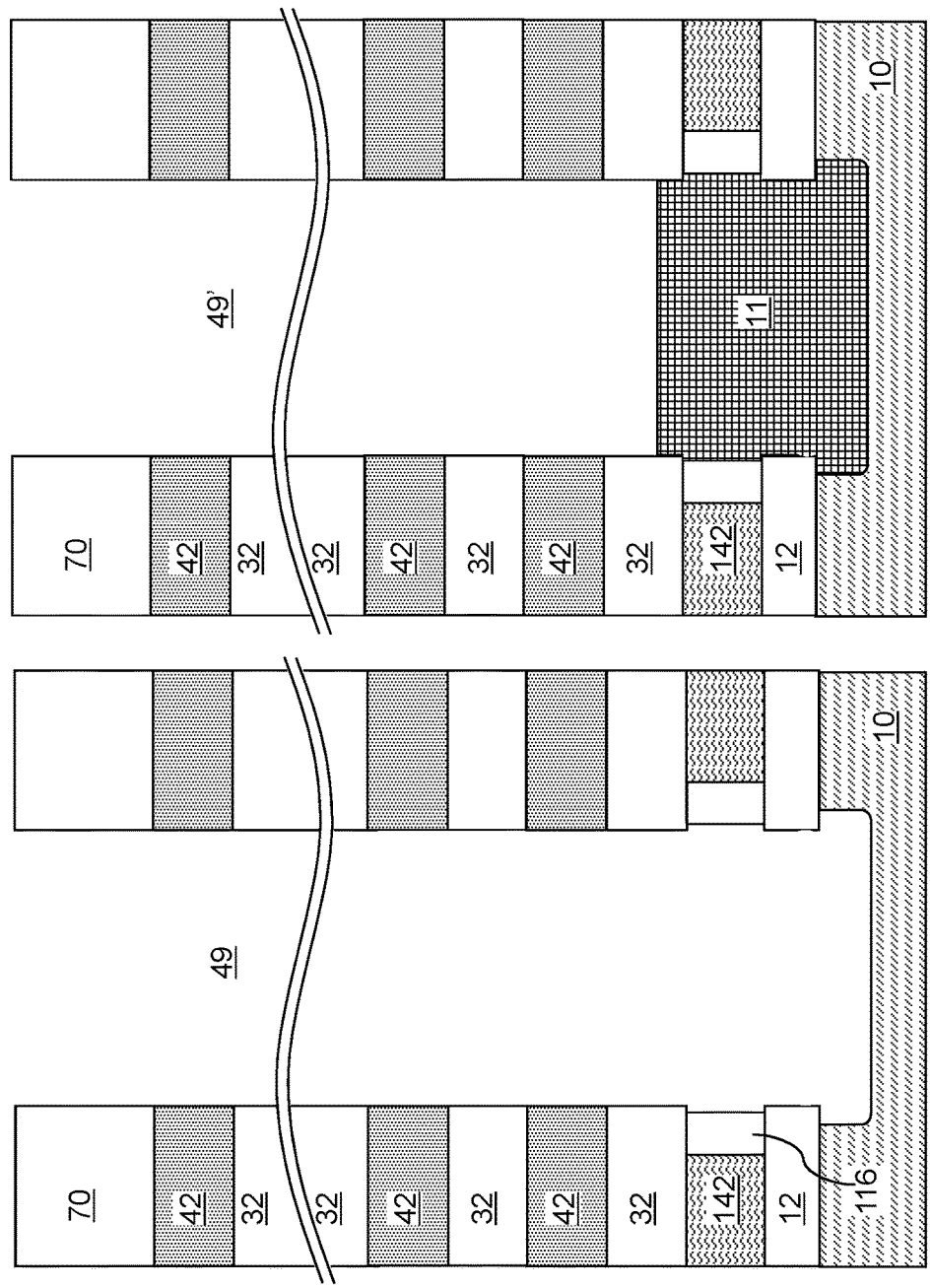

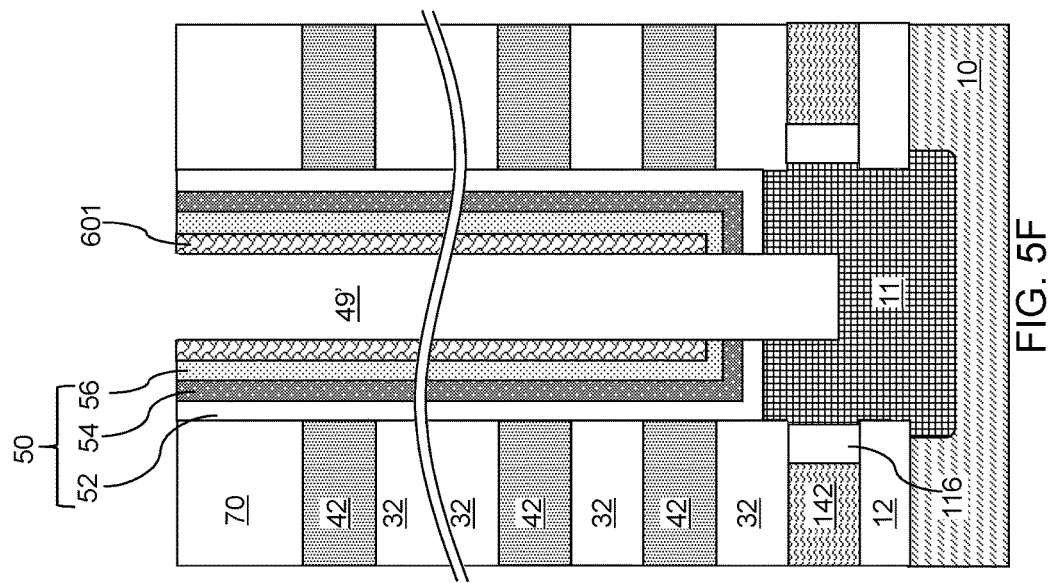
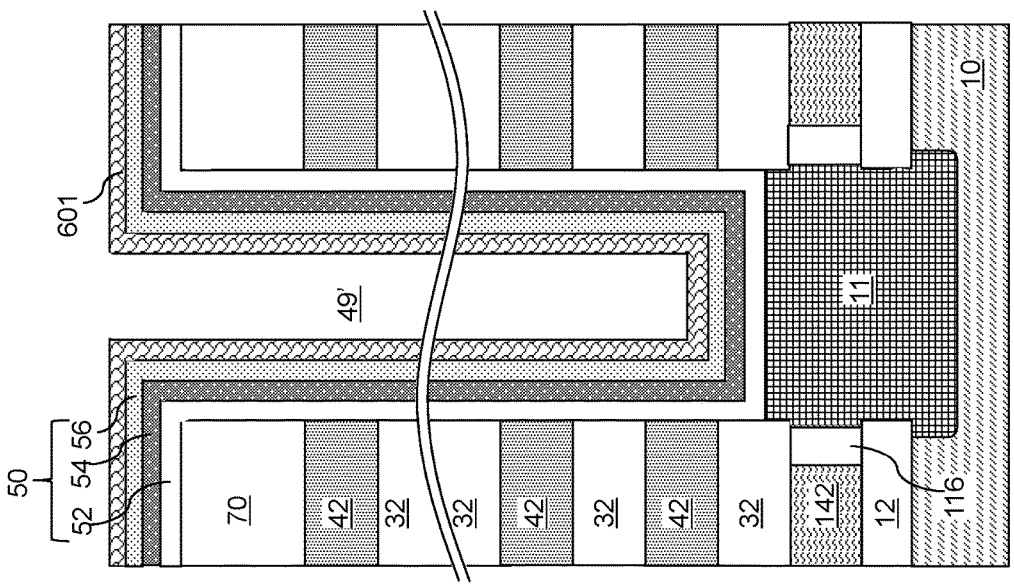

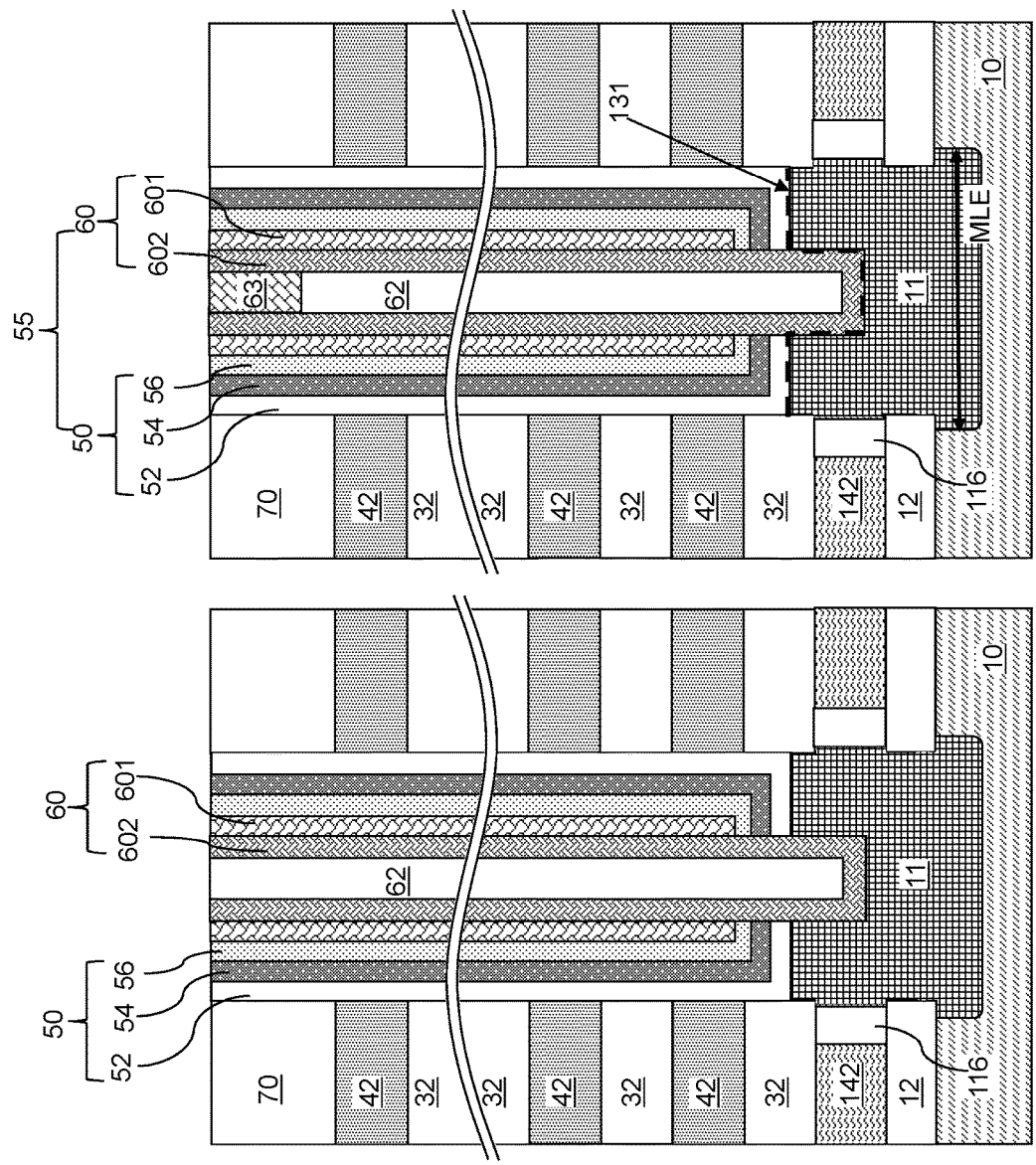

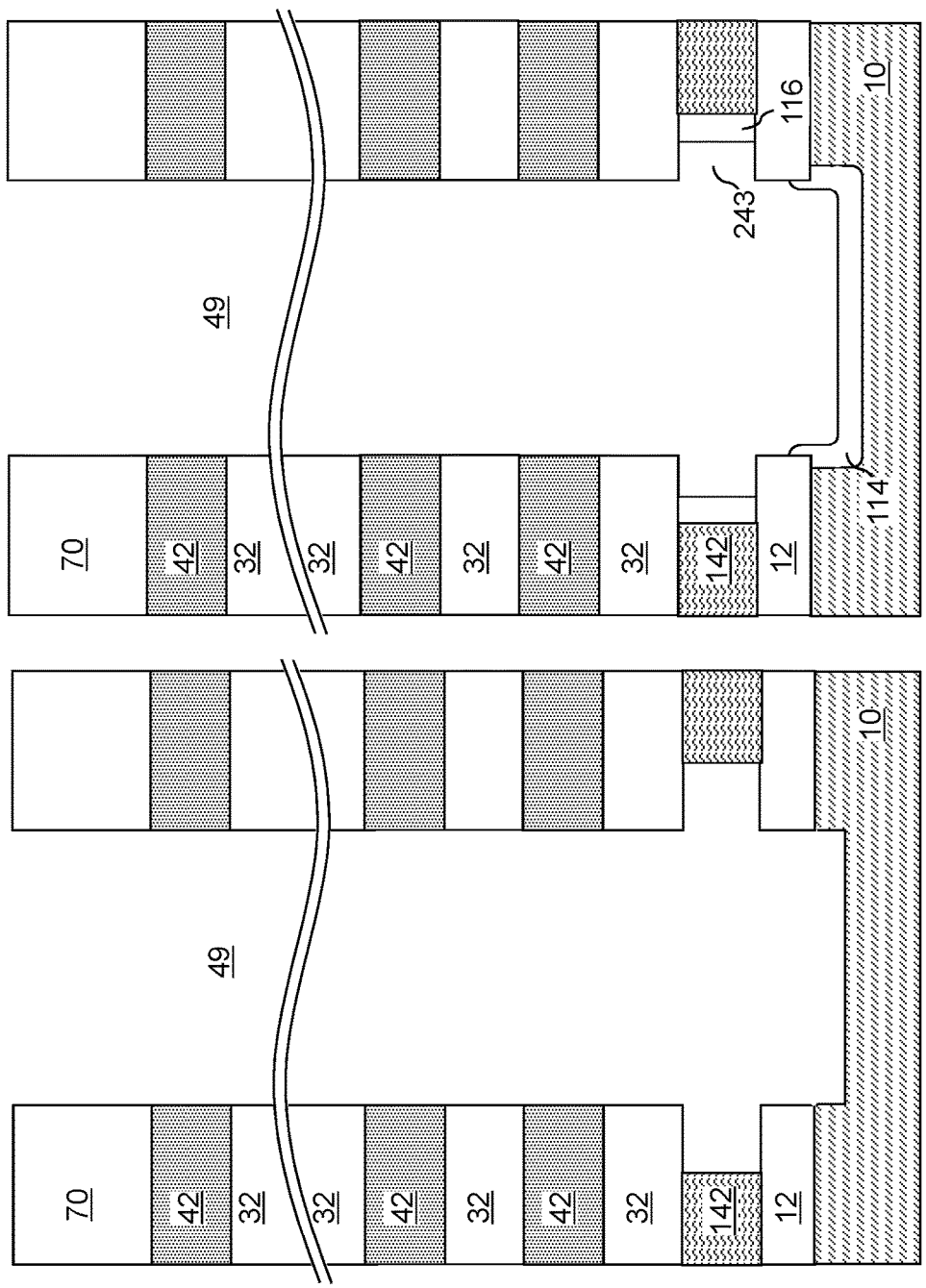

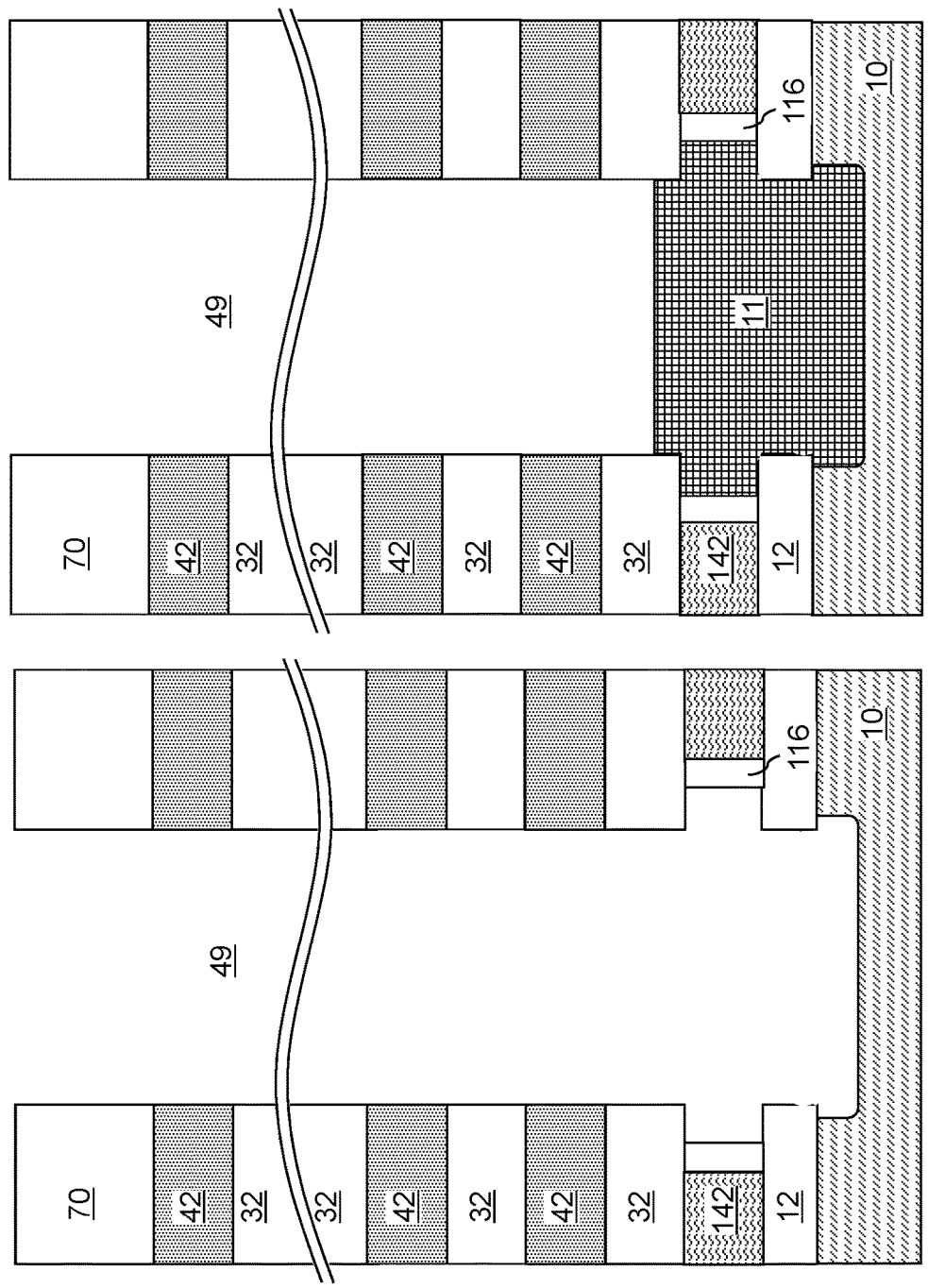

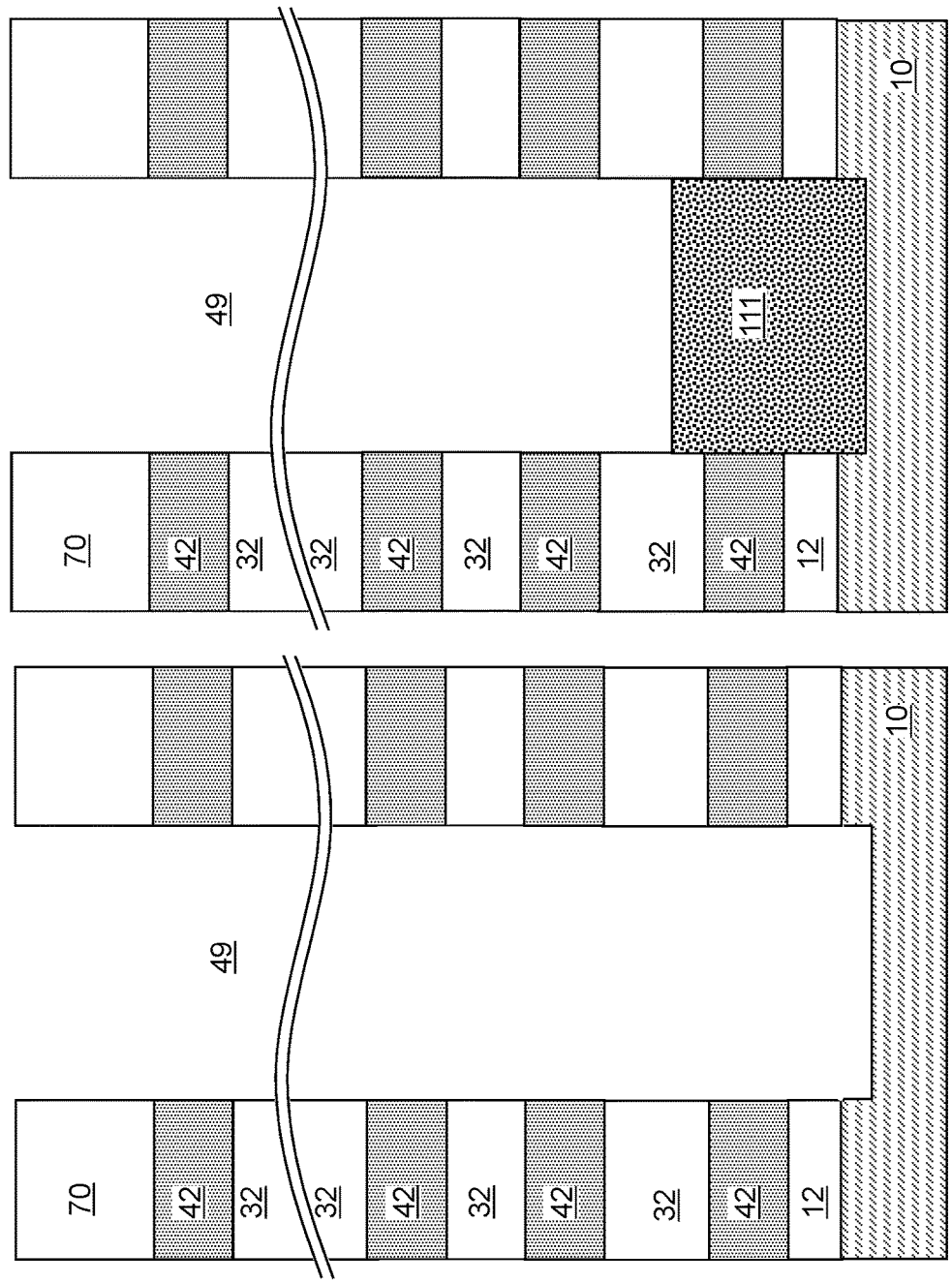

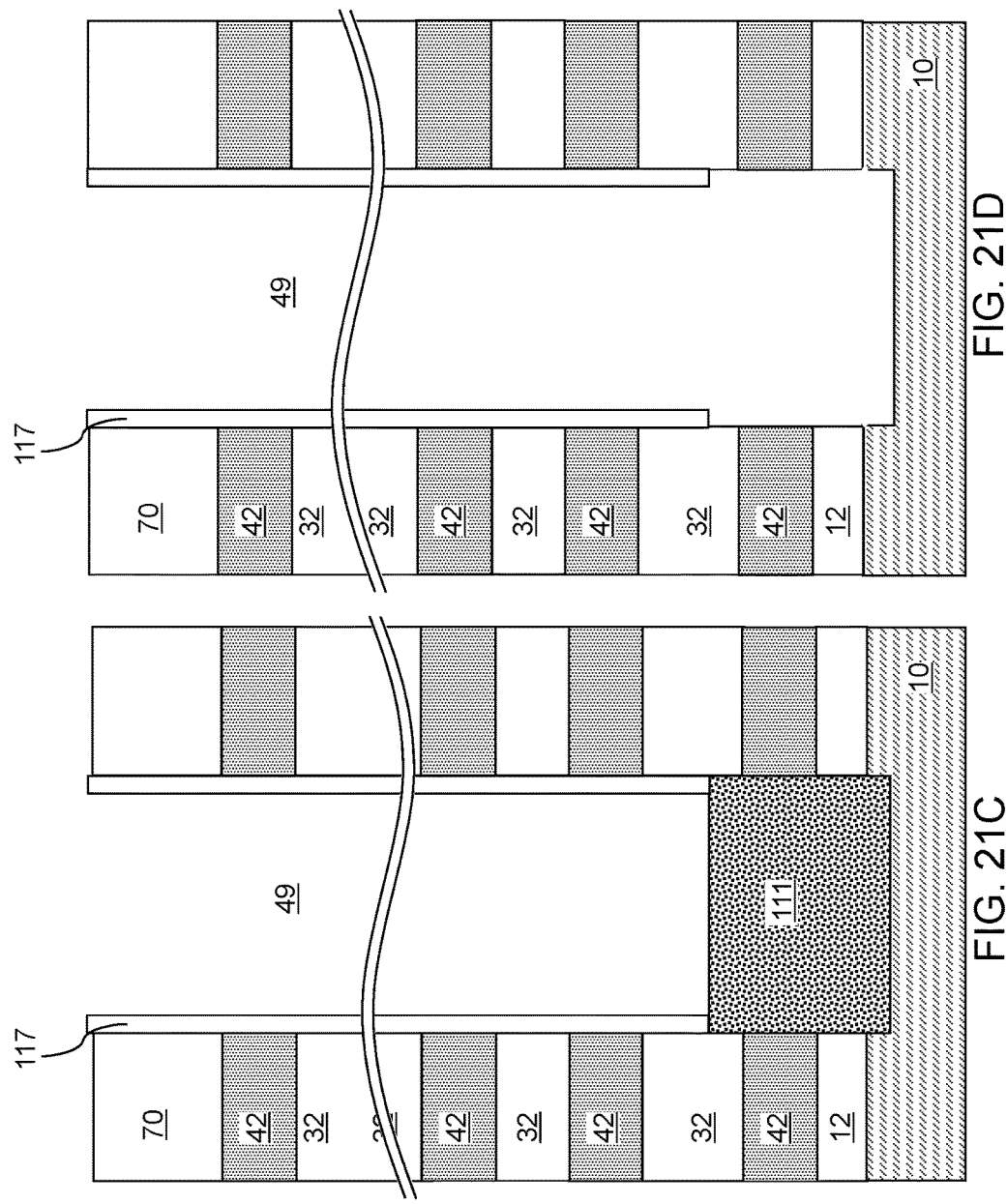

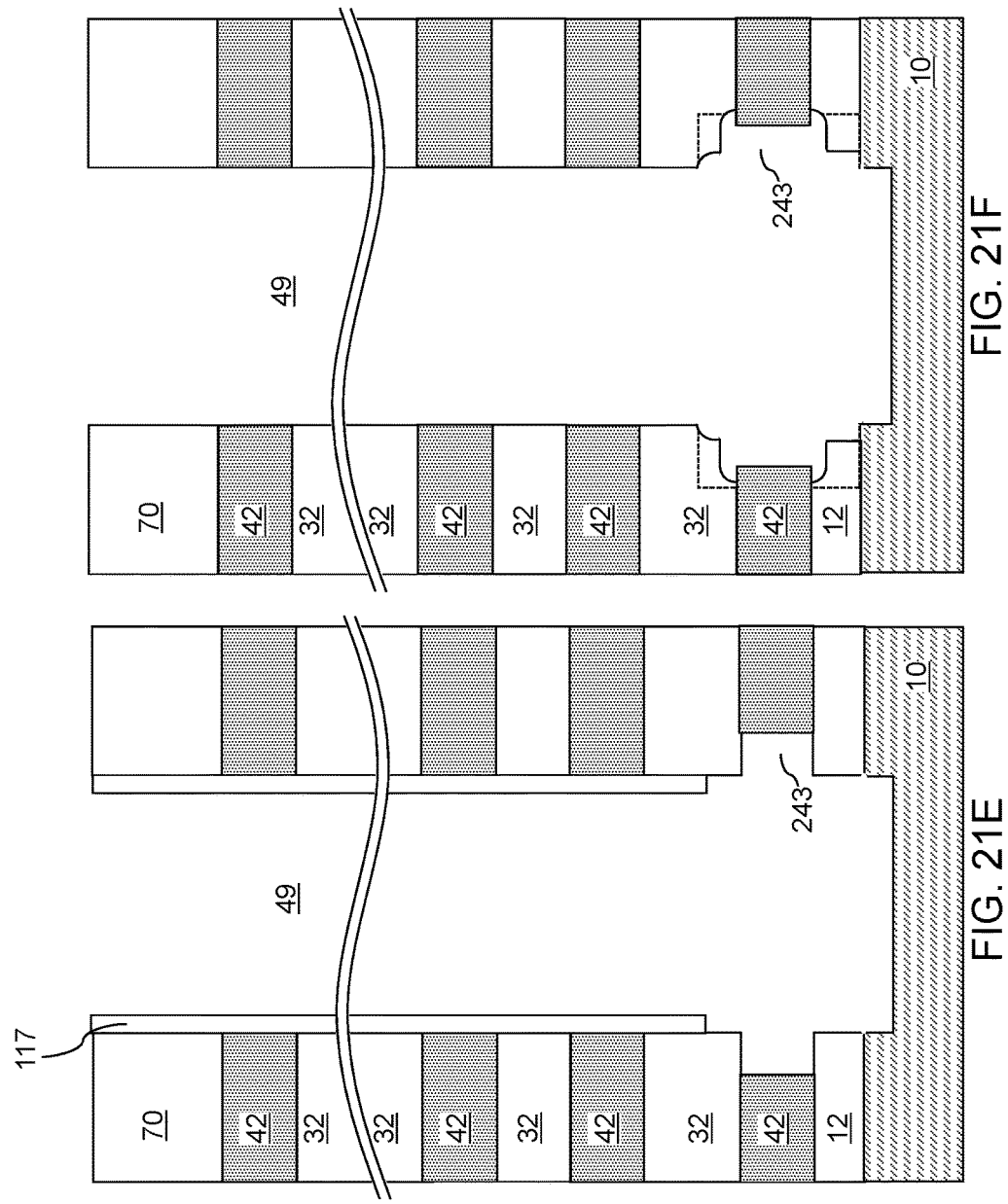

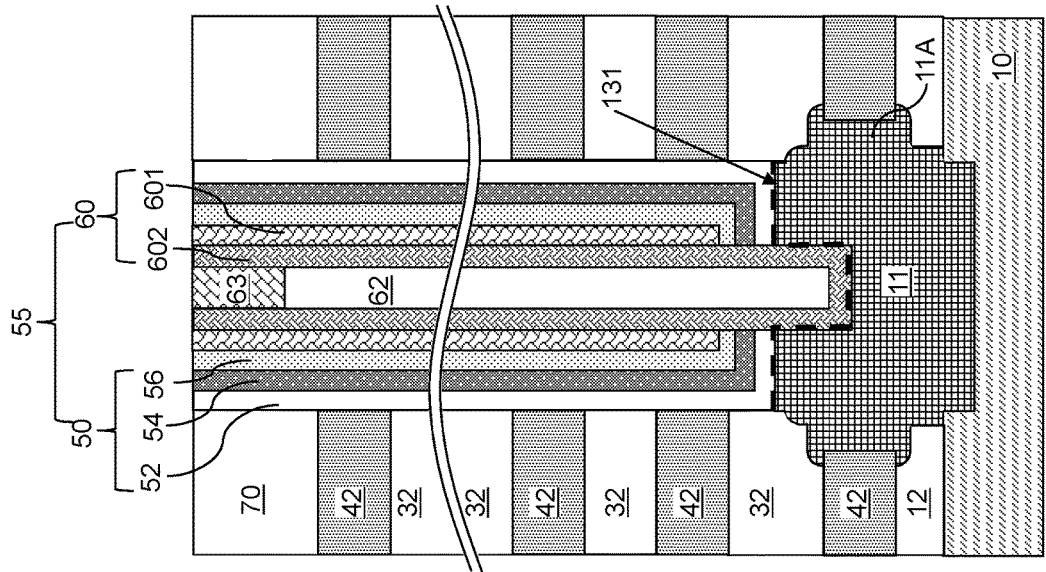
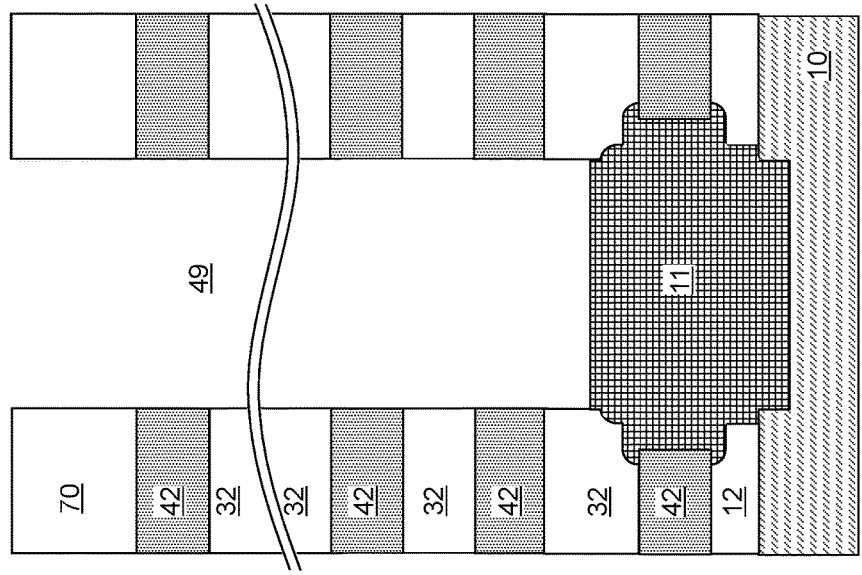

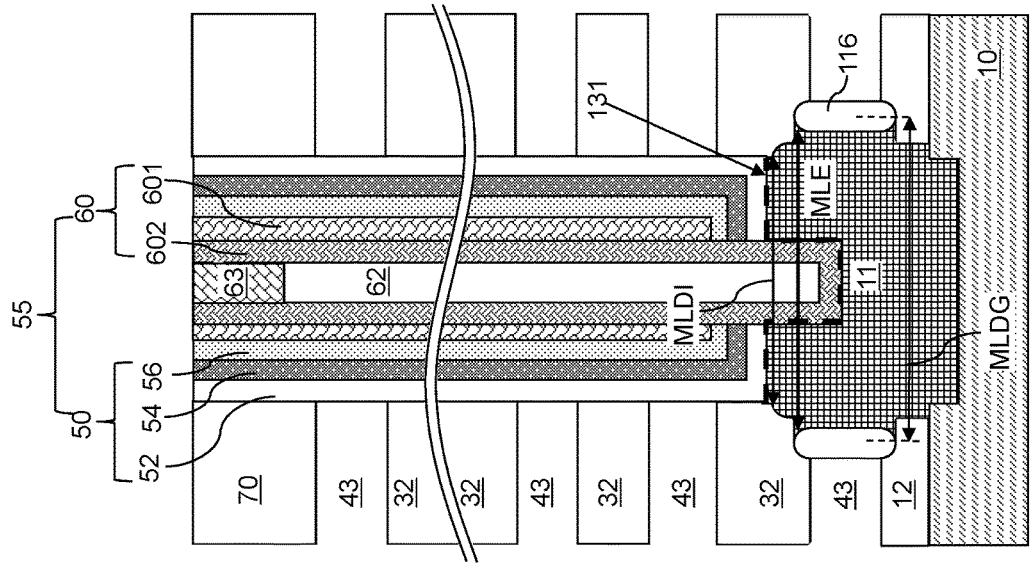
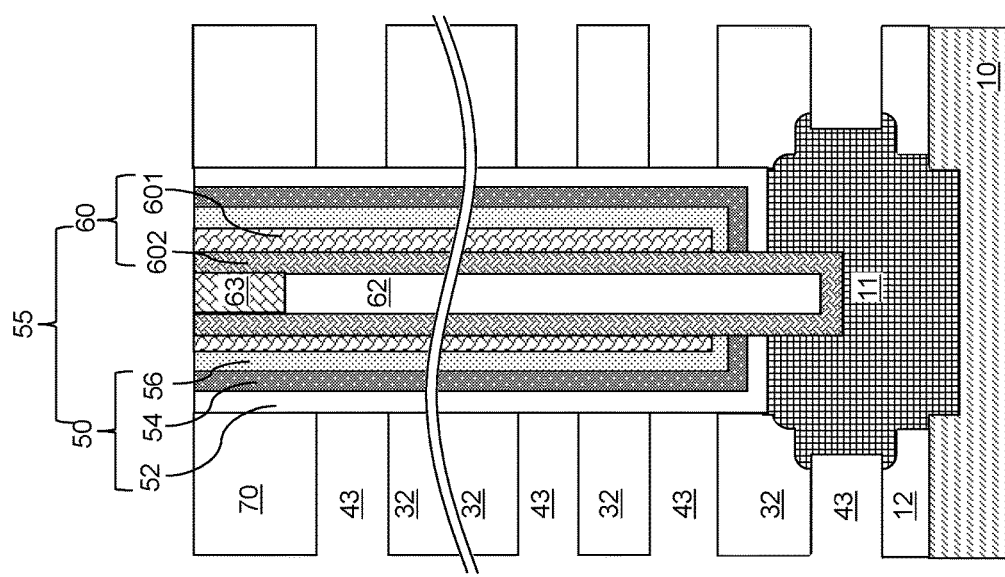
FIG. 22A
FIG. 22B

THREE-DIMENSIONAL MEMORY DEVICE CONTAINING STRUCTURALLY REINFORCED PEDESTAL CHANNEL PORTIONS AND METHOD OF MAKING THEREOF

FIELD

The present disclosure relates generally to the field of semiconductor devices, and particular to a three-dimensional memory device employing structurally reinforced pedestal channel portions and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a semiconductor surface; a memory opening extending through the alternating stack; a pedestal channel portion located at a bottom portion of the memory opening, comprising a semiconductor material, and contacting a top surface of the semiconductor surface; and a memory stack structure located in the memory opening and contacting a top surface of the pedestal channel portion, wherein the memory stack structure comprises a memory film and a vertical semiconductor channel located inside the memory film. A maximum lateral extent of the pedestal channel portion is greater than a maximum lateral dimension of an entire interface between the pedestal channel portion and the memory stack structure. The maximum lateral extent of the pedestal channel portion is provided above a horizontal plane including a top surface of the bottommost electrically conductive layer among the electrically conductive layers or below a horizontal plane including a bottom surface of a bottommost electrically conductive layer.

According to another aspect of the present disclosure, a method of forming a three-dimensional memory device is provided. A gate dielectric layer, a sacrificial silicon-containing layer, and an alternating stack of insulating layers and sacrificial material layers is formed over a semiconductor surface. The sacrificial material layers comprise a different material than the sacrificial silicon-containing layer. A memory opening having an initial memory opening volume is formed through the alternating stack, the sacrificial silicon-containing layer, and the gate dielectric layer. An annular silicon oxide spacer is formed at least by converting a portion of the sacrificial silicon-containing layer into a silicon oxide portion through the memory opening employing an oxidation process. An entire volume of the annular silicon oxide spacer is located outside the initial memory opening volume at a level of the sacrificial silicon-containing layer. A pedestal channel portion is formed at a bottom portion of the memory opening by a selective semiconductor deposition process. A memory stack structure is formed in a remaining volume of the memory opening and directly on the pedestal channel portion. The memory stack structure comprises a memory film and a vertical semiconductor channel. The sacrificial material layers and the sacrificial silicon-containing layer are replaced with electrically conductive layers.

According to yet another aspect of the present disclosure, a method of forming a three-dimensional memory device comprises forming an alternating stack of insulating layers and sacrificial material layers over a semiconductor surface, forming a memory opening through the alternating stack, wherein a top surface of the semiconductor surface is physically exposed at a bottom of the memory opening, laterally recessing a sidewall of the bottommost sacrificial material layer through the memory opening, forming a pedestal channel portion at a bottom portion of the memory opening by a selective semiconductor deposition process, forming a memory stack structure in a remaining volume of the memory opening and directly on the pedestal channel portion, wherein the memory stack structure comprises a memory film and a vertical semiconductor channel, forming backside recesses by removing the sacrificial material layers selective to the insulating layers and the pedestal channel portion, forming an annular silicon oxide spacer by oxidizing a surface portion of the pedestal channel portion, and forming electrically conductive layers in the backside recesses.

BRIEF DESCRIPTION OF THE DRAWINGS

FIGS. 5A-5J are sequential schematic vertical cross-sectional views of a memory opening within the first exemplary structure during formation of a memory opening fill structure according to the first embodiment of the present disclosure.

FIGS. 14A-14E are sequential schematic vertical cross-sectional views of a memory opening within a second exemplary structure during formation of a second exemplary memory opening fill structure according to the second embodiment of the present disclosure.

FIGS. 21A-21H are sequential schematic vertical cross-sectional views of a memory opening within the third exemplary structure during formation of a third exemplary memory opening fill structure according to the third embodiment of the present disclosure.

FIGS. 22A-22C are sequential schematic vertical cross-sectional views of a memory opening within the third exemplary structure during replacement f sacrificial material layers with electrically conductive layers according to the third embodiment of the present disclosure.

DETAILED DESCRIPTION

Figure 1:
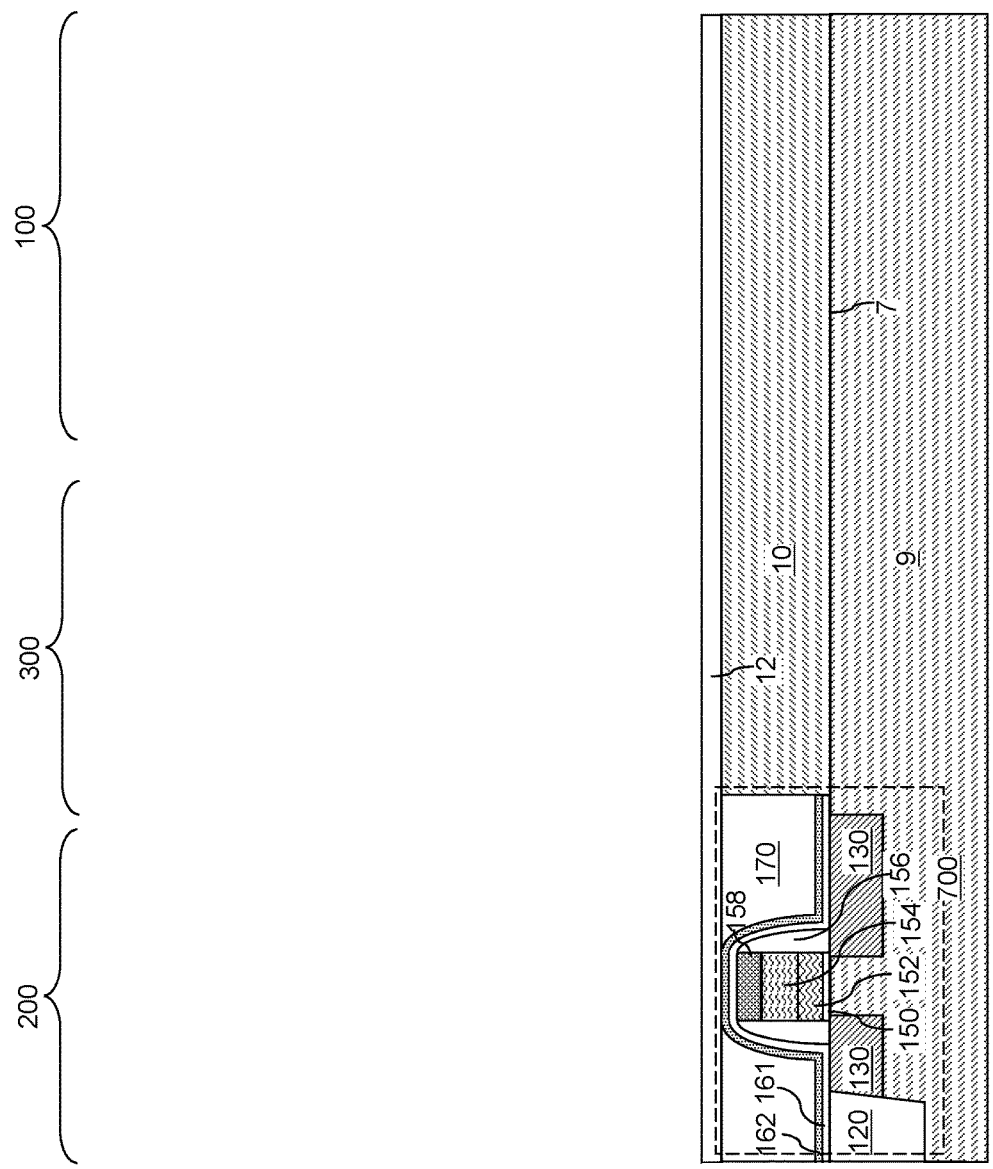
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include be a single memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
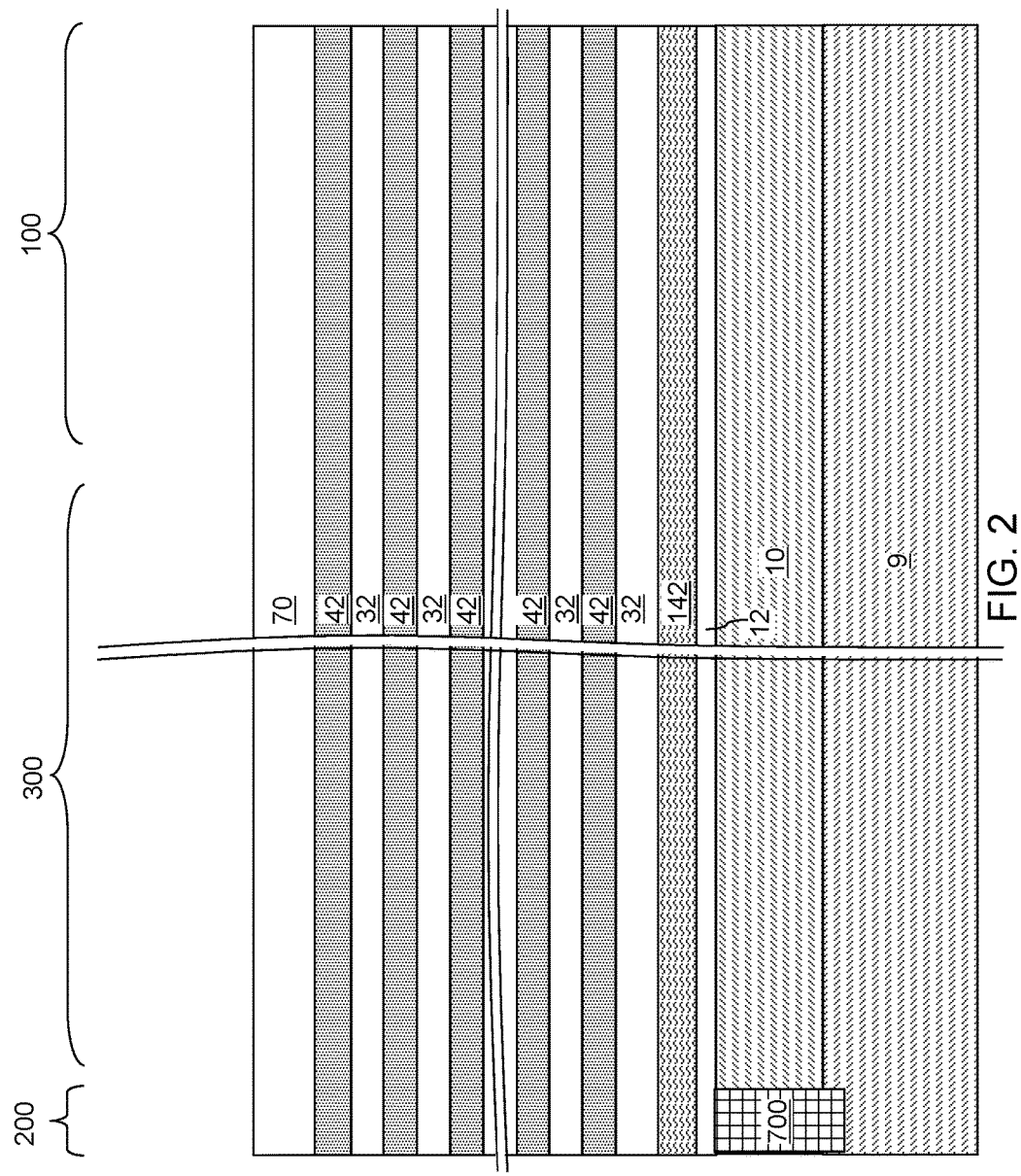
FIG. 2 is a schematic vertical cross-sectional view of the first exemplary structure after formation of a sacrificial silicon-containing layer and an alternating stack of insulating layers and sacrificial material layers according to the first embodiment of the present disclosure.

Referring to FIG. 2, a sacrificial silicon-containing layer 142 is formed over the gate dielectric layer 12. The sacrificial silicon-containing layer 142 includes, and can consist essentially of, a silicon-containing material such as amorphous silicon, polysilicon, or a silicon-germanium alloy with atomic concentration of germanium less than 10%. The sacrificial silicon-containing layer 142 can be doped with electrical dopants, such as p-type dopants or n-type dopants. In one embodiment, the sacrificial silicon-containing layer 142 can be doped with dopants that enhance the oxidation rate of the silicon-containing material, such as phosphorous. The sacrificial silicon-containing layer 142 can be deposited by a conformal or non-conformal deposition process, and can have a thickness in a range from 20 nm to 50 nm, although lesser and greater thicknesses can be employed.

A stack of an alternating plurality of first material layers (which can be insulating layers 32) and second material layers (which can be sacrificial material layer 42) is formed over the sacrificial silicon-containing layer 142. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 is different from the material of the sacrificial silicon-containing layer 142. The second material of the sacrificial material layers 42 can be subsequently replaced with electrically conductive electrodes which can function, for example, as control gate electrodes of a vertical NAND device. Non-limiting examples of the second material include silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
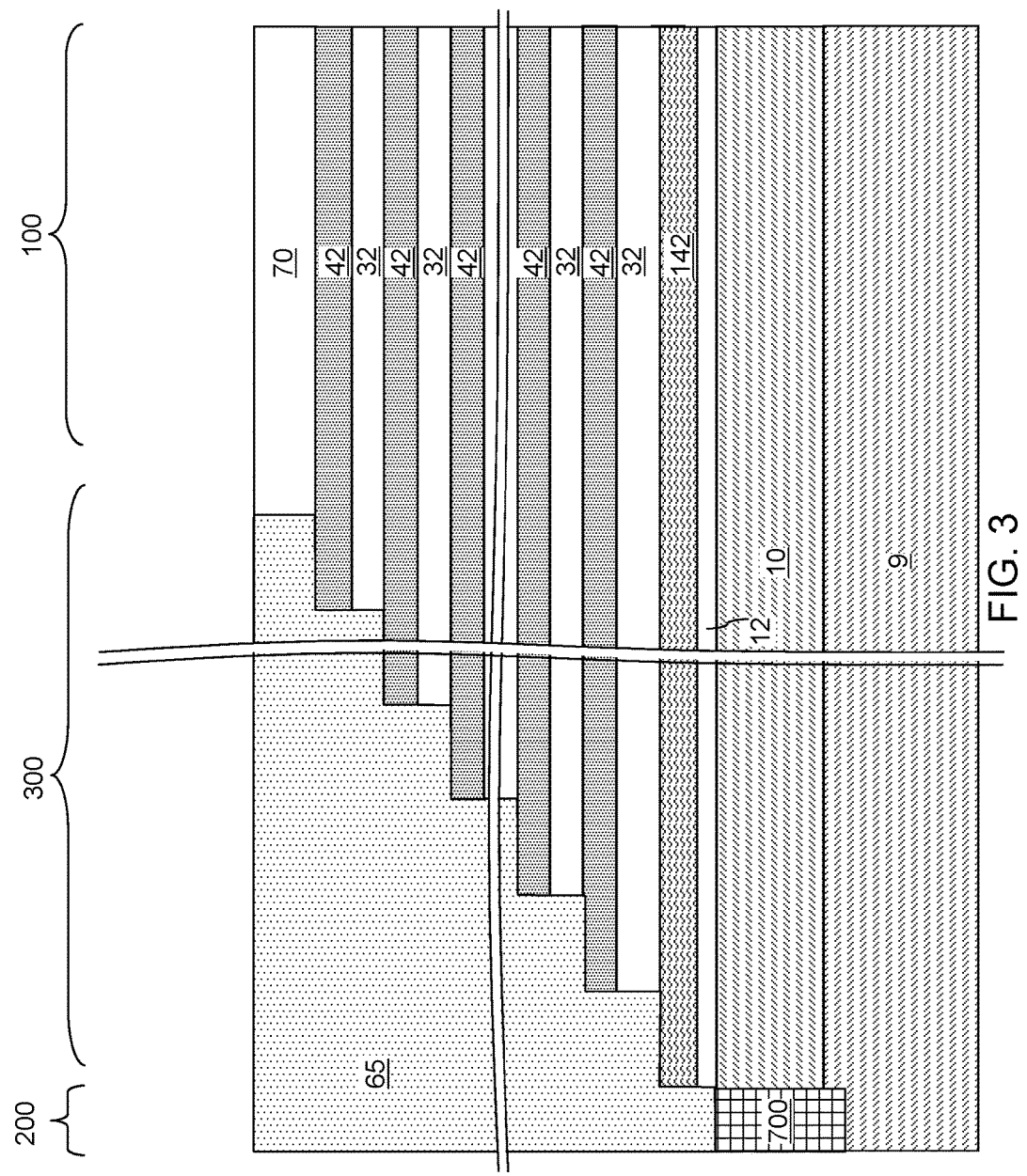
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the memory array region (e.g., memory plane) 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). The sacrificial silicon-containing layer 142 and the gate dielectric layer 12 can be patterned to extend the stepped surfaces to the top surface of the substrate (9, 10).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures (not shown) can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
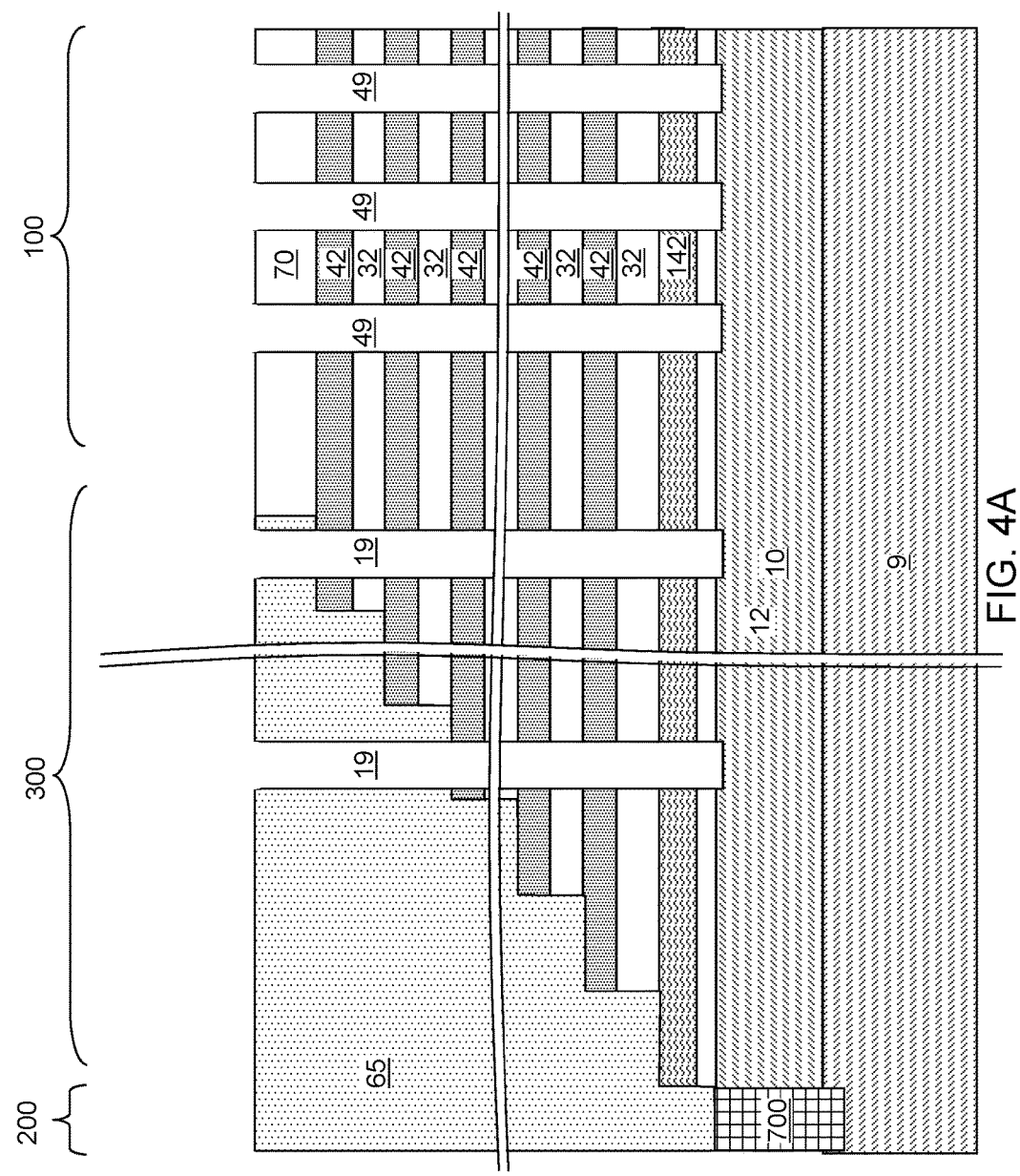
FIG. 4A is a schematic vertical cross-sectional view of the first exemplary structure after formation of memory openings and support openings according to the first embodiment of the present disclosure.
Figure 4B:
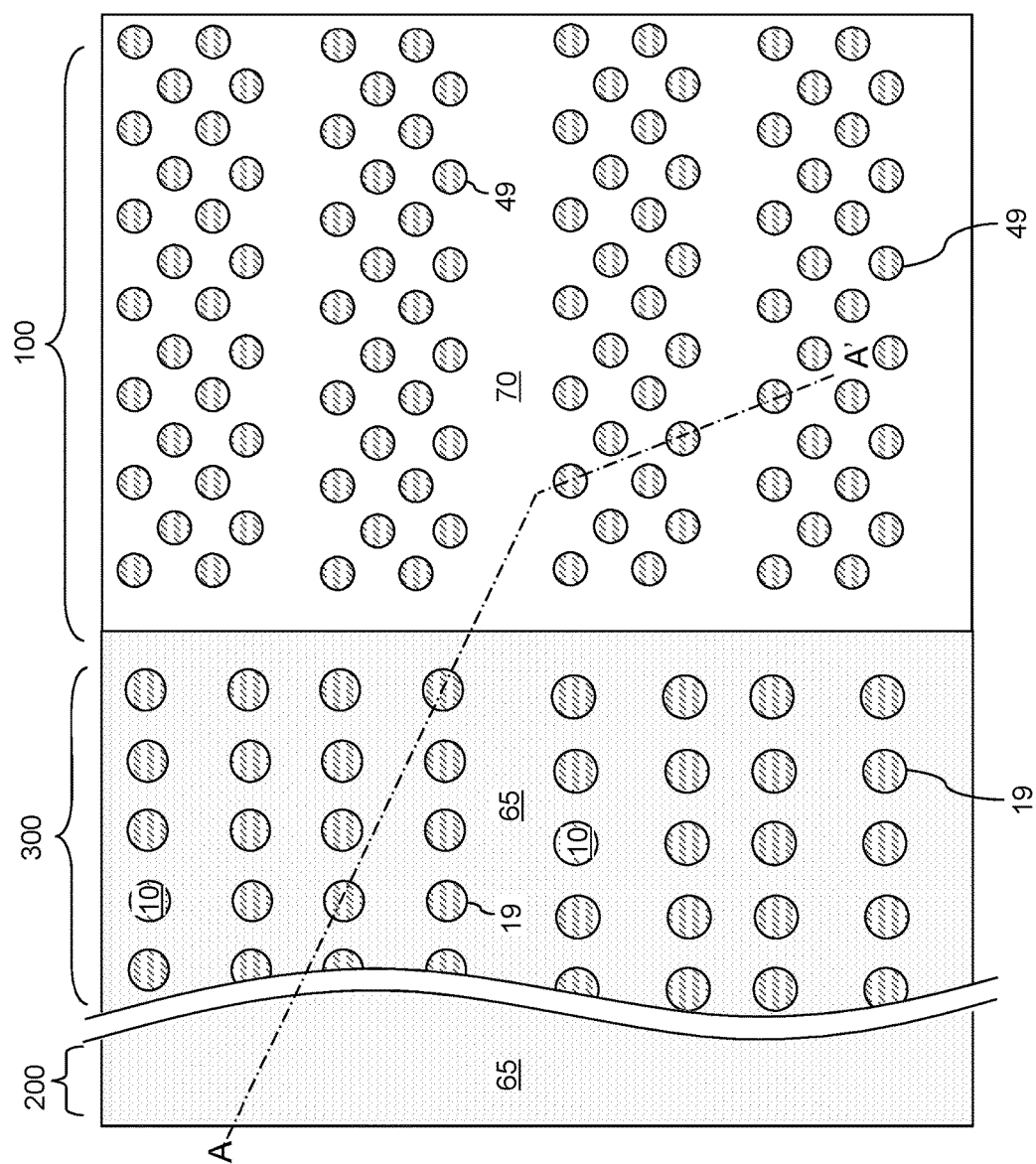
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. Each memory opening 49 has a substantially cylindrical initial volume, which is herein referred to as an initial memory opening volume. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), the sacrificial silicon-containing layer 142, and the gate dielectric layer 12, and optionally into an upper portion of the semiconductor material layer 10. At this processing step, the support openings 19 can extend through the retro-stepped dielectric material portion 65, a subset of layers in the alternating stack (32, 42), the sacrificial silicon-containing layer 142, and the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. A recessed top surface, and optionally sidewalls, of the semiconductor material layer 10 is physically exposed at the bottom of the memory opening 49 upon formation of the memory openings 49.

Referring to FIG. 5B, an oxidation process is performed to convert surface portions of the sacrificial silicon-containing layer 142 into a silicon oxide portion 115 around each memory opening 49 and around each support opening 19. Each silicon oxide portion 115 includes an outer sub-portion located outside the initial memory opening volume and at the level of the sacrificial silicon-containing layer 142 and an inner sub-portion located inside the initial memory opening volume. Each silicon oxide portion 115 can have an annular shape. In one embodiment, each silicon oxide portion 115 can have a substantially vertical outer sidewall that contacts a substantially vertical sidewall of the sacrificial silicon-containing layer 142, and an inner sidewall including a substantially vertical portion, an upper convex portion, and a lower convex portion. The lateral thickness of each annular silicon oxide spacer, as measured between the outer sidewall and the inner sidewall, can be in a range from 6 nm to 60 nm, although lesser and greater thicknesses can also be employed.

Surface portions of the semiconductor material layer 10 underlying each memory opening 49 are oxidized during formation of the annular silicon oxide spacers 115 to form a substrate semiconductor oxide portion 114. If the sacrificial silicon-containing layer 142 includes phosphorous-doped polysilicon, the sacrificial silicon-containing layer 142 can be oxidized at a greater rate than the semiconductor material layer 10. Thus, the lateral thickness of the silicon oxide portion 115 can be greater than the thickness of the substrate semiconductor oxide portion 114. For example, the ratio of the lateral thickness of the silicon oxide portion 115 to the thickness of the substrate semiconductor oxide portion 114 can be in a range from 1.3 to 4.0, such as from 1.5 to 3.0, although lesser and greater ratios can also be employed.

Referring to FIG. 5C, an etch process can be performed to recess the inner sidewall of each silicon oxide portion 115, while completely removing each substrate semiconductor oxide portion 114. The etch process may be an isotropic etch process or an anisotropic etch process. In one embodiment, the etch process can be an isotropic etch process such as a wet etch process or a dry etch process. In one embodiment, the isotropic etch process can be a chemical dry etch process that etches an entirety of the substrate semiconductor oxide portion 114 and etches only an inner sub-portion of the silicon oxide portion 115. In another embodiment, the etch process can be an anisotropic etch, such as a reactive ion etch, followed by an isotropic etch, such as chemical dry etch. An inner sub-portion of the silicon oxide portion 115 located within the initial memory opening volume is removed by the isotropic etch process. Optionally, the inner sidewalls of each silicon oxide portion 115 may be recessed outward from the vertical plane including the sidewalls of the alternating stack (32, 42) around each memory opening 49. Each remaining portion of the silicon oxide portions 115 constitutes annular silicon oxide spacer 116 located under an insulating layer in the alternating stack without protruding into the memory opening 49.

Referring to FIG. 5D, a pedestal channel portion 11 can be formed at the bottom portion of each memory opening 49 and each support openings 19 by a selective semiconductor deposition process. In one embodiment, the selective semiconductor deposition process may be a selective epitaxy process. If the semiconductor material layer 10 includes a single crystalline material, each pedestal channel portion 11 comprises a single crystalline semiconductor material in epitaxial alignment with the single crystalline semiconductor material of the semiconductor material layer 10. Alternatively, the semiconductor material layer 10 may be polycrystalline, and the pedestal channel portions 11 may be polycrystalline.

In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of the sacrificial silicon-containing layer 142. In this case, a source select gate electrode can be subsequently formed by subsequently replacing the sacrificial silicon-containing layer 142 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon or polycrystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5E, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5F, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5G:
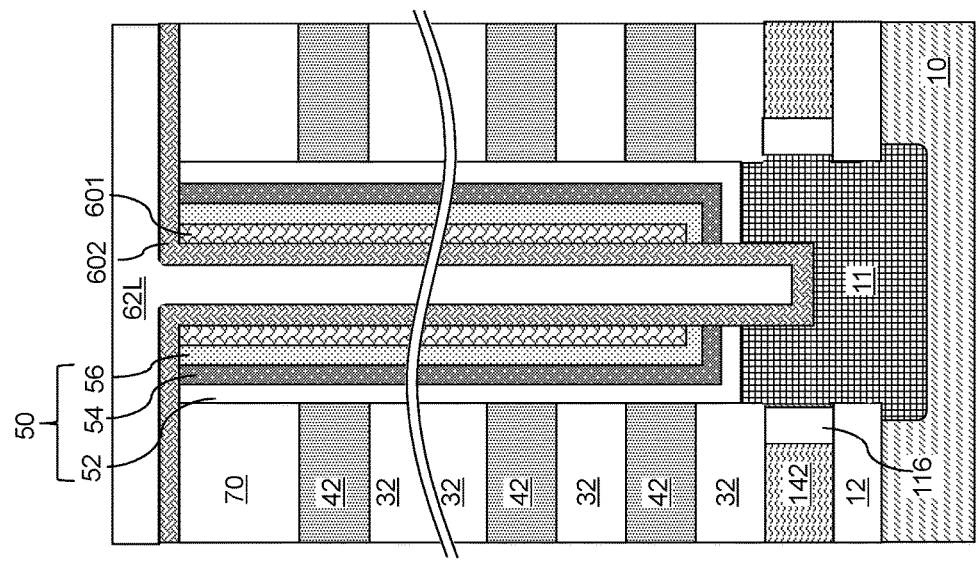

Referring to FIG. 5G, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5H:
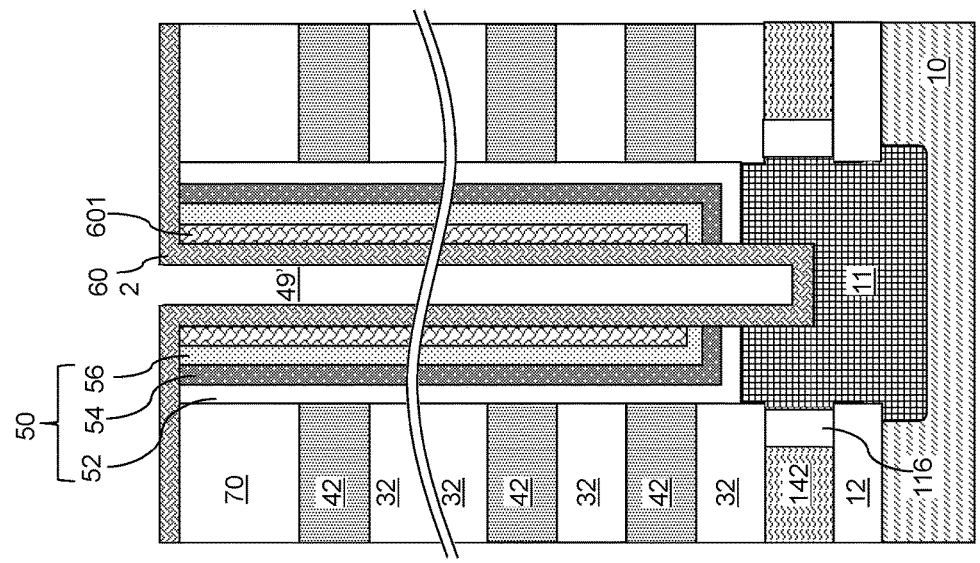

Referring to FIG. 5H, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5I, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5J, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

The maximum along the lateral distances between pairs of points located in, or directly on, the epitaxial channel portion 11 and located within a same horizontal plane is herein referred to as the maximum lateral extent MLE of the epitaxial channel portion 11. In other words, the maximum lateral extent MLE of each pedestal channel portion 11 is the maximum lateral dimension of the horizontal cross-sectional shapes of the pedestal channel portion 11. As used herein, a "maximum lateral extent" or a "maximum lateral dimension" is the maximum of all measurable lateral extents or the maximum of all measurable lateral dimensions. Each lateral extent and each lateral dimension is measured within a respective horizontal plane that is parallel to the top surface of the substrate (9, 10). In one embodiment, the maximum lateral extent MLE for each epitaxial channel portion 11 can occur for a pair of points located on opposing sidewalls of the epitaxial channel portion 11 that contact the semiconductor material layer 10. In this case, the maximum lateral extent MLE of the pedestal channel portion 11 is a lateral separation distance between vertical portions of the interface between the pedestal channel portion 11 and the semiconductor material layer 10. In one embodiment, the maximum lateral extent MLE for an epitaxial channel portion 11 can be greater than the maximum lateral dimension of the memory opening 49 as originally formed by at least 1 nm, such as by a dimension in a range from 2 nm to 40 nm.

Figure 6:
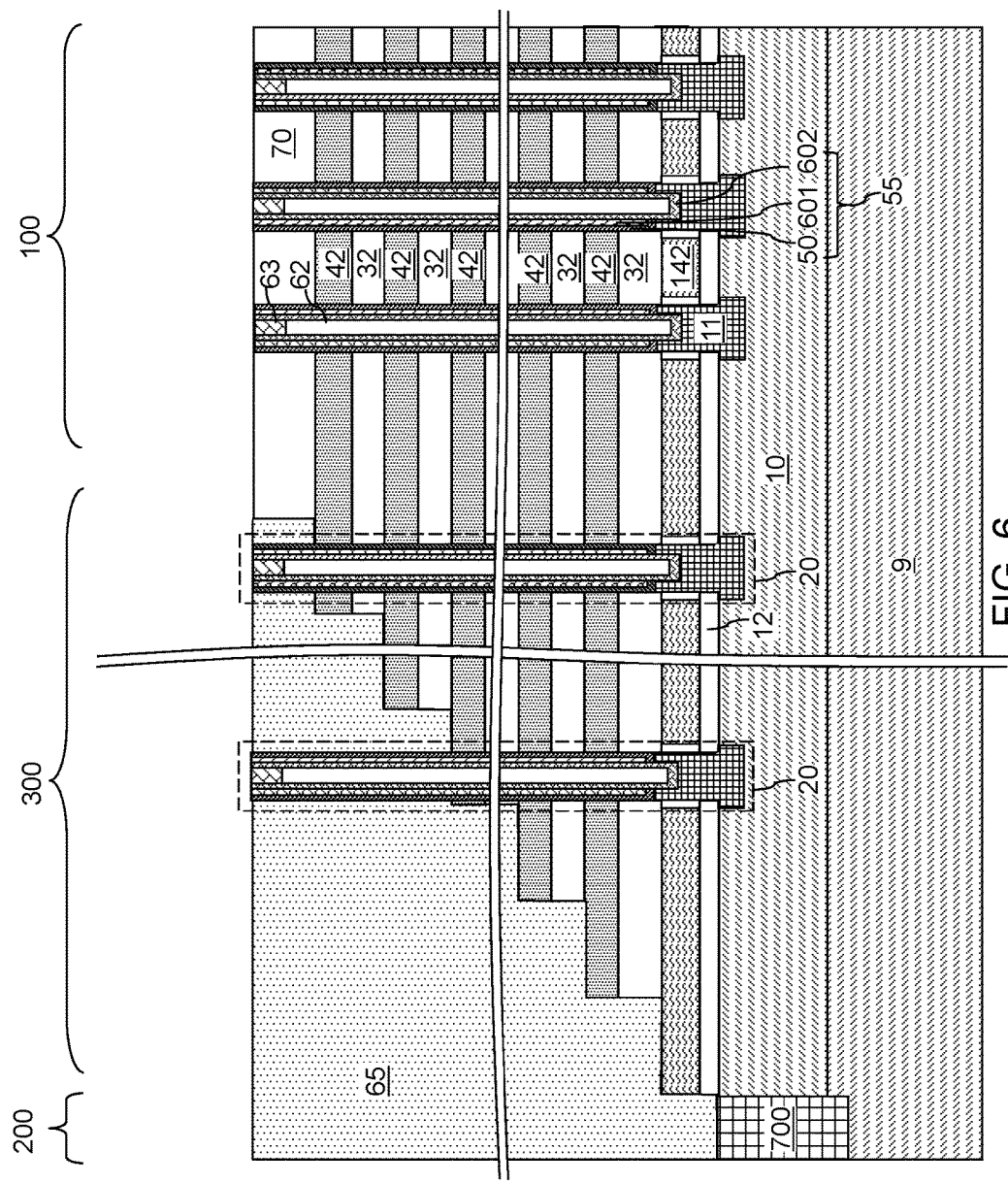
FIG. 6 is a schematic vertical cross-sectional view of the first exemplary structure after formation of memory stack structures and support pillar structures according to the first embodiment of the present disclosure.

The annular silicon oxide spacer 116 contacts, and laterally surrounds, the pedestal channel portion 11 around each memory opening. Around each memory opening 49, the entire inner sidewall of the annular silicon oxide spacer 116 can be located at, or outside, a cylindrical vertical plane including a periphery of the entire interface 131 between the pedestal channel portion 11 and the memory stack structure 55. In one embodiment, the interface between the semiconductor material layer 10 and the pedestal channel portion 11 includes a cylindrical sidewall having a maximum lateral dimension that may be the same as, or may be greater than, the maximum lateral dimension of the entire interface 131 between the pedestal channel portion 11 and the memory stack structure 55. In one embodiment, the maximum lateral extent MLE of the pedestal channel portion 11 can be greater than the maximum lateral dimension of the cylindrical sidewall Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
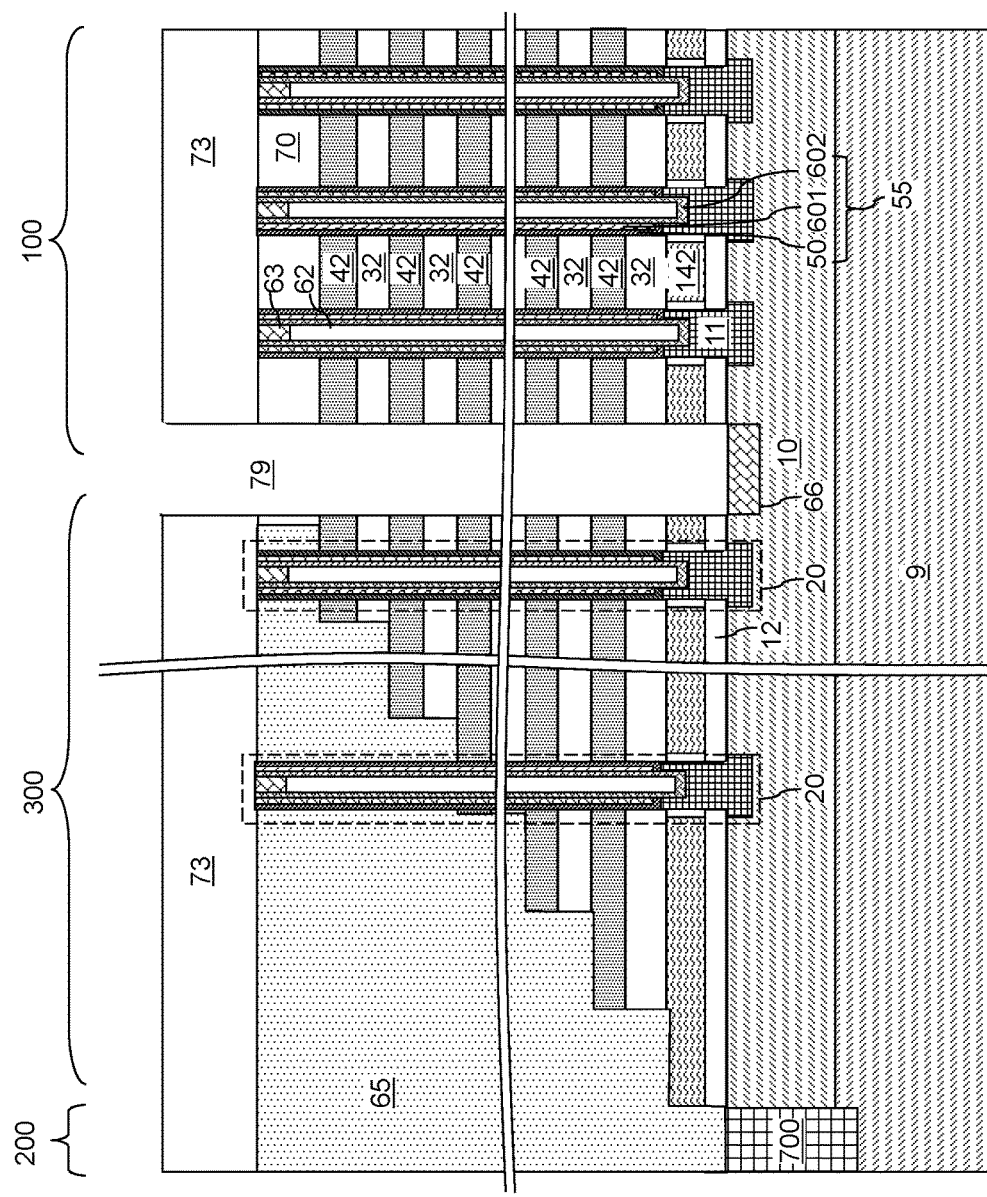
FIG. 7A is a schematic vertical cross-sectional view of the first exemplary structure after formation of backside trenches according to the first embodiment of the present disclosure.
Figure 7B:
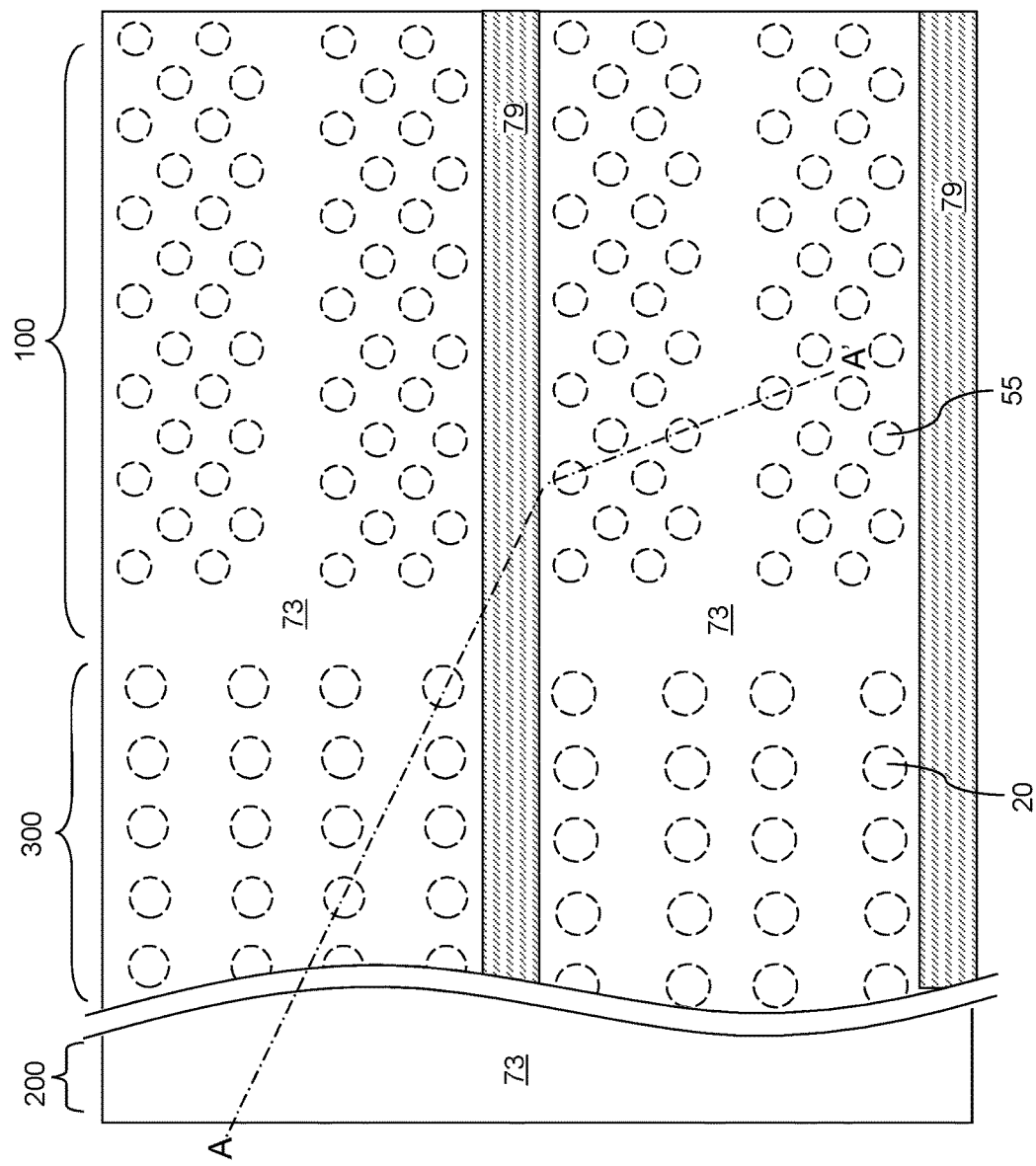
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing. Optionally, boron can be implanted into the top surface of the substrate (9, 10) through the backside trenches 79 to form a boron doped region 66 which protects the top surface of the substrate during a subsequent selective etch of the sacrificial silicon-containing layer 142.

Figure 8:
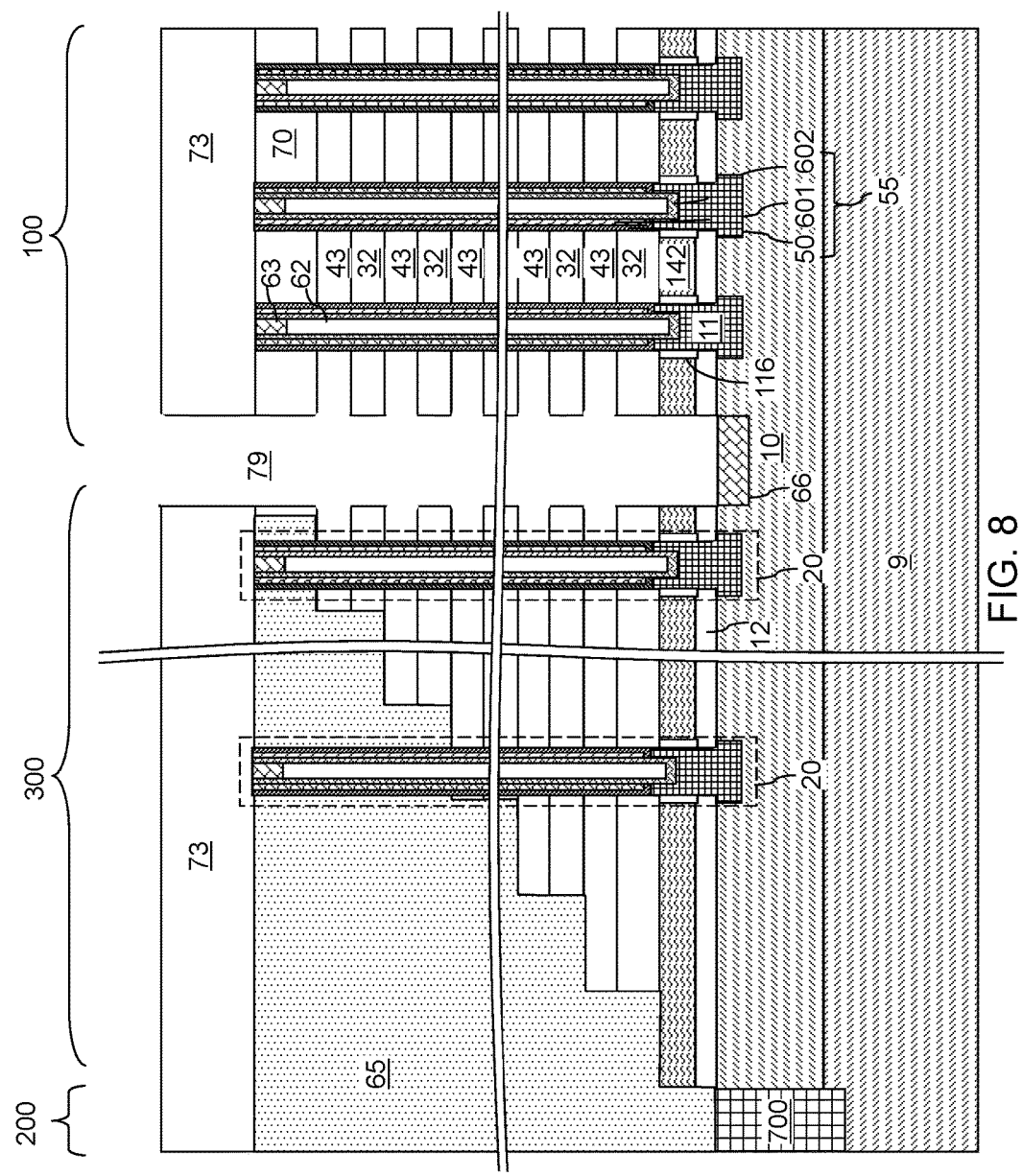
FIG. 8 is a schematic vertical cross-sectional view of the first exemplary structure after formation of backside recesses according to the first embodiment of the present disclosure.

Referring to FIG. 8, an etchant that selectively etches the second material of the sacrificial material layers 42 with respect to the first material of the insulating layers 32 and the material of the semiconductor material layer 10 can be introduced into the backside trenches 79, for example, employing an etch process. The etch process may, or may not, be selective to the material of the sacrificial silicon-containing layer 142. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 9:
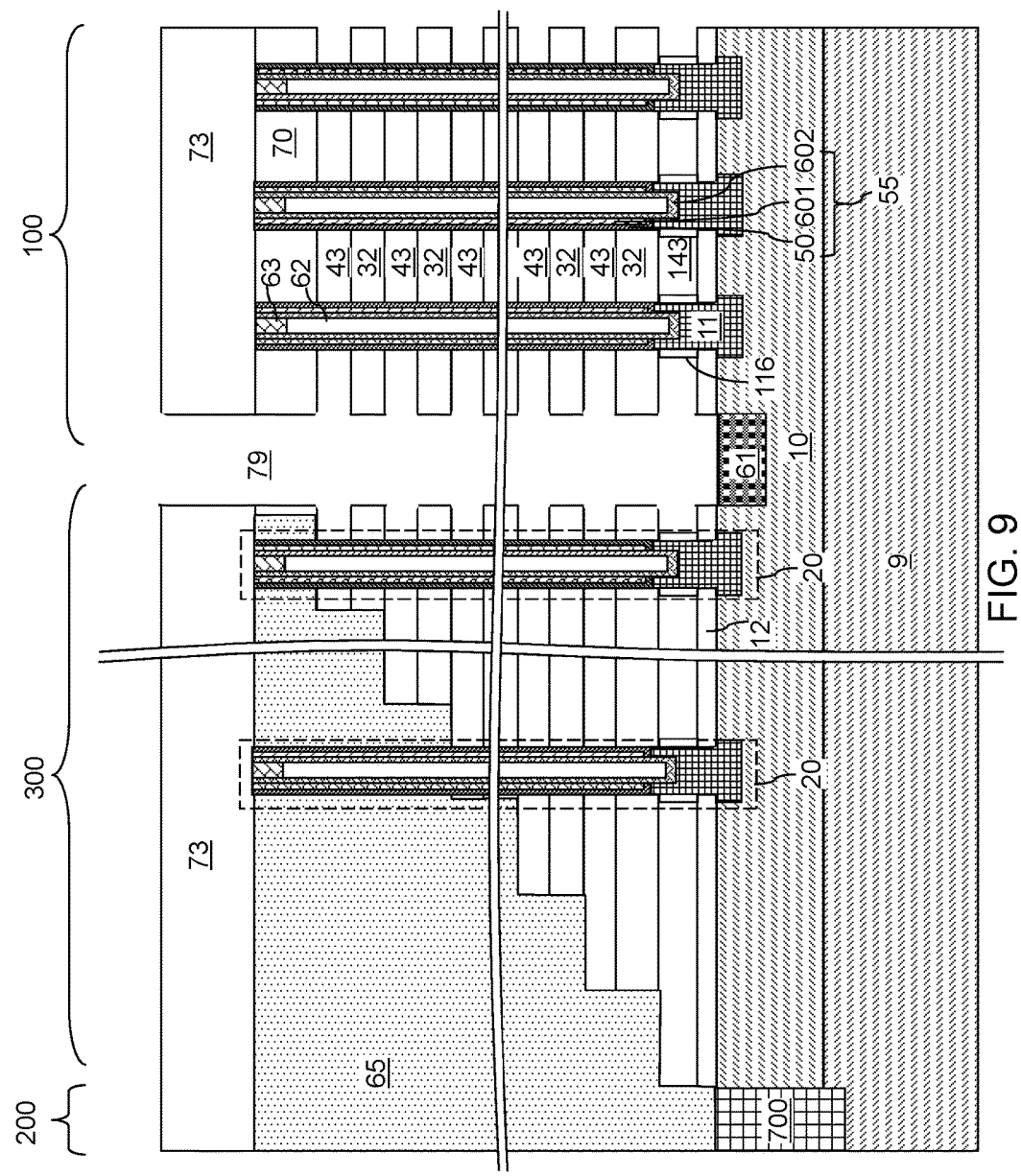
FIG. 9 is a schematic vertical cross-sectional view of the first exemplary structure after formation of source select level backside recesses and tubular dielectric spacers according to the first embodiment of the present disclosure.

Referring to FIG. 9, the sacrificial silicon-containing layer 142 can be removed selective to the insulating layers 32 and the semiconductor material layer 10. For example, if the sacrificial silicon-containing layer 142 includes heavily doped silicon (such as phosphorous-doped silicon), a wet etch process that etches heavily doped silicon selective to undoped or lightly doped silicon may be employed to remove the sacrificial silicon-containing layer 142 selective to the materials of the insulating layers 32, the outermost layer of the memory films 50, the annular silicon oxide spacers 116, and the semiconductor material layer 10. For example, the wet etch may use a trimethyl-2 hydroxyethyl ammonium hydroxide (TMY) solution. The boron doped region 66 protects the top surface of the substrate (9, 10) from being etched by the TMY solution because the TMY solution etches the phosphorus doped sacrificial silicon-containing layer 142 selective to the boron doped region 66. A source select level cavity 143 is formed in the volumes from which the sacrificial silicon-containing layer 142 is removed. An n-type source region 61 may be formed in the top surface of the substrate (9, 10) by implanting n-type dopant ions, such as arsenic ions, into the boron doped region 66 in the top surface of the substrate through the backside trench 79. Alternatively, the source region 61 may be formed at a later step in the process by implanting n-type dopant ions through the backside trench 79 into the boron doped region 66.

Figure 10:
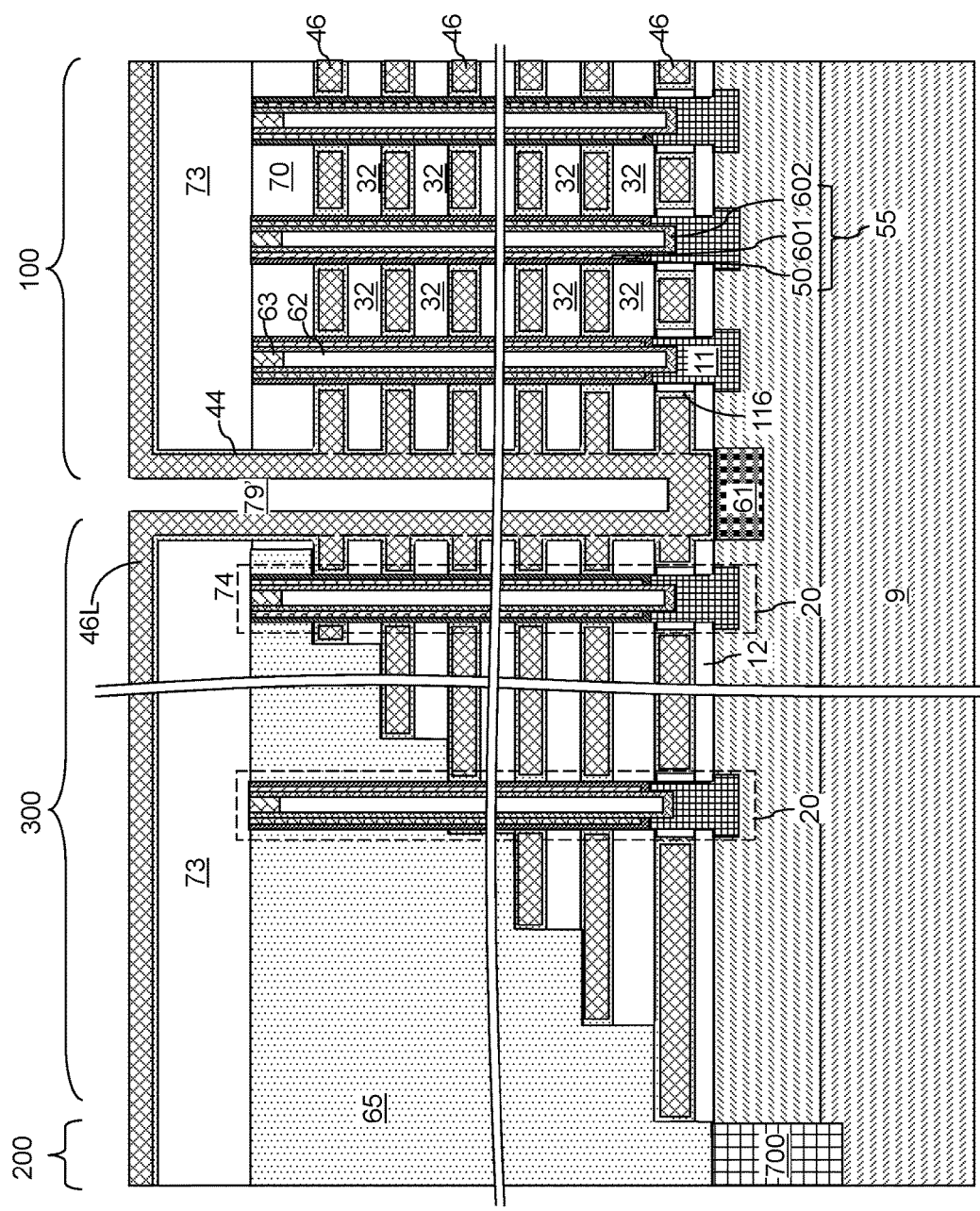
FIG. 10 is a vertical cross-sectional view of the first exemplary structure after formation of electrically conductive layers by deposition of a conductive material according to the first embodiment of the present disclosure.

Referring to FIG. 10, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43 and sidewalls of the annular silicon oxide spacers 116. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and the outer sidewalls of the annular silicon oxide spacers 116. A backside cavity 79' is present within the portion of each backside trench 79 that is not filled with the backside blocking dielectric layer 44.

At least one conductive material is deposited in the backside recesses 43 and the source select level backside recess 143 by a respective conformal deposition process. For example, the at least one conductive material can include a metallic barrier layer and a metallic fill material. In this case, the metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43 and in the source select level backside recess 143. A continuous metallic material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. The sacrificial silicon-containing layer 142 can be replaced with a bottommost one of the electrically conductive layers 46. A backside cavity 79' is present in the portion of each backside trench 79 that is not filled with the backside blocking dielectric layer 44 and the continuous metallic material layer 46L. An annular silicon oxide spacer 116 laterally surrounds a pedestal channel portion 11. The bottommost electrically conductive layer 46 laterally surrounds each annular silicon oxide spacer 116 upon formation of the electrically conductive layers 46. The bottommost electrically conductive layer 46 functions as a source side select gate electrode of a source side select transistor of a vertical NAND string, as will be described in more detail below.

Figure 11:
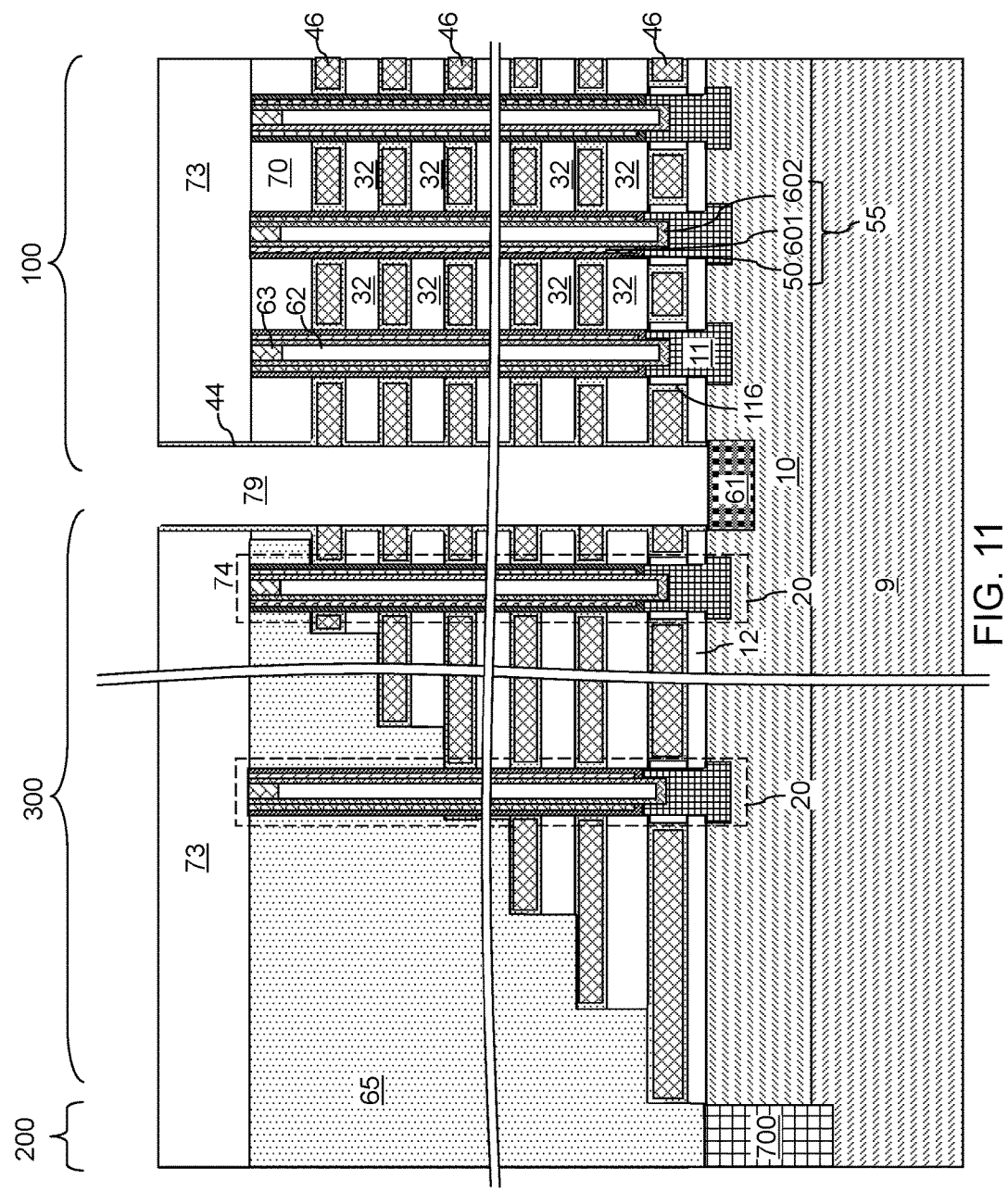
FIG. 11 is a schematic vertical cross-sectional view of the first exemplary structure after removal of a deposited conductive material from within the backside trench according to the first embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 other than the bottommost electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. The gate dielectric layer 12 can be vertically spaced from the backside trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. A backside cavity 79' is present within each backside trench 79.

Figure 12:
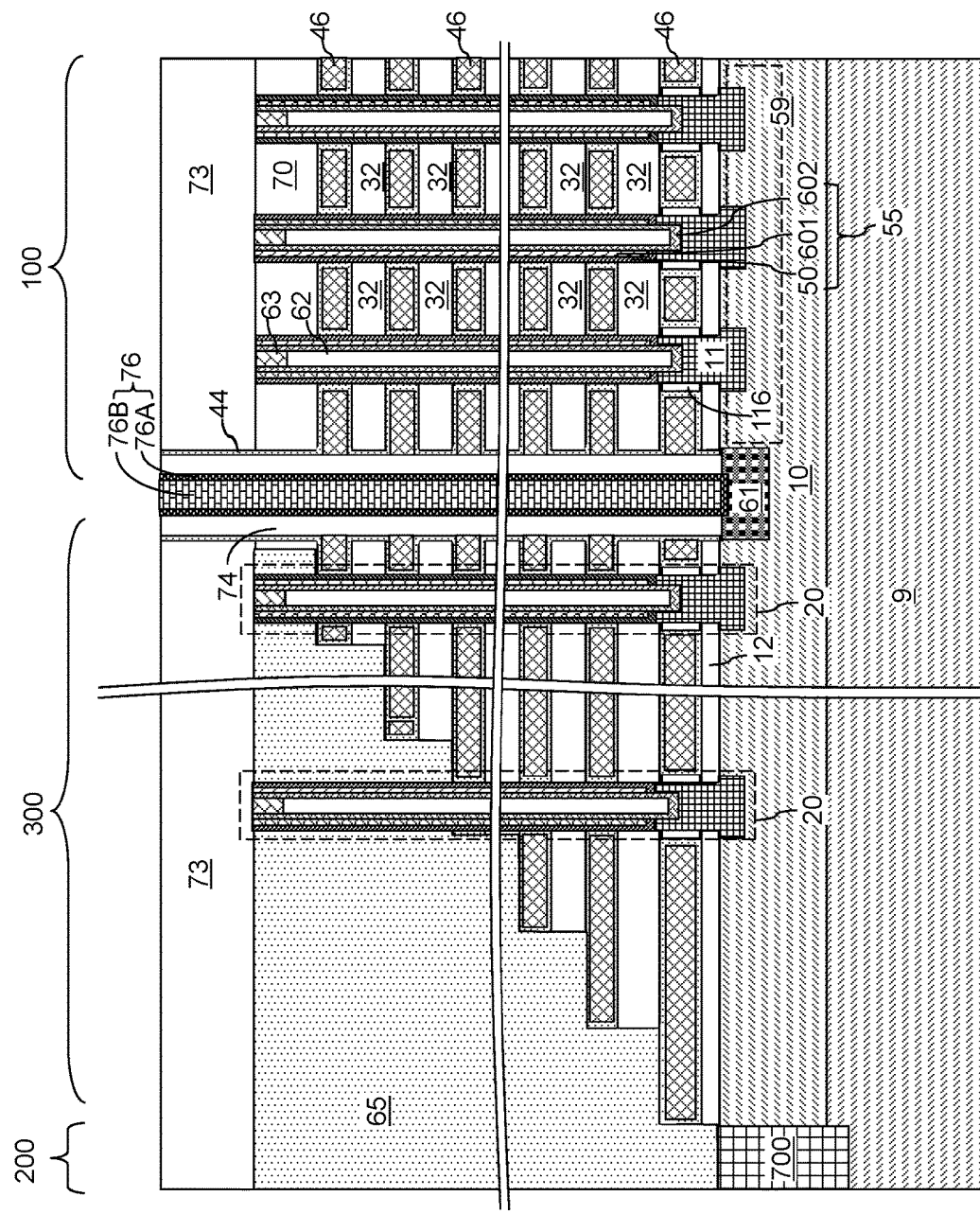
FIG. 12 is a schematic vertical cross-sectional view of the first exemplary structure after formation of insulating spacers and backside contact structures according to the first embodiment of the present disclosure.

Referring to FIG. 12, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 at the bottom of each backside cavity 79'. A top surface of the semiconductor material layer 10 can be physically exposed at the bottom of each backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

A bottommost electrically conductive layer 46 provided upon formation of the electrically conductive layers 46 within the alternating stack (32, 46) can comprise a source side select gate electrode for the source side select transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
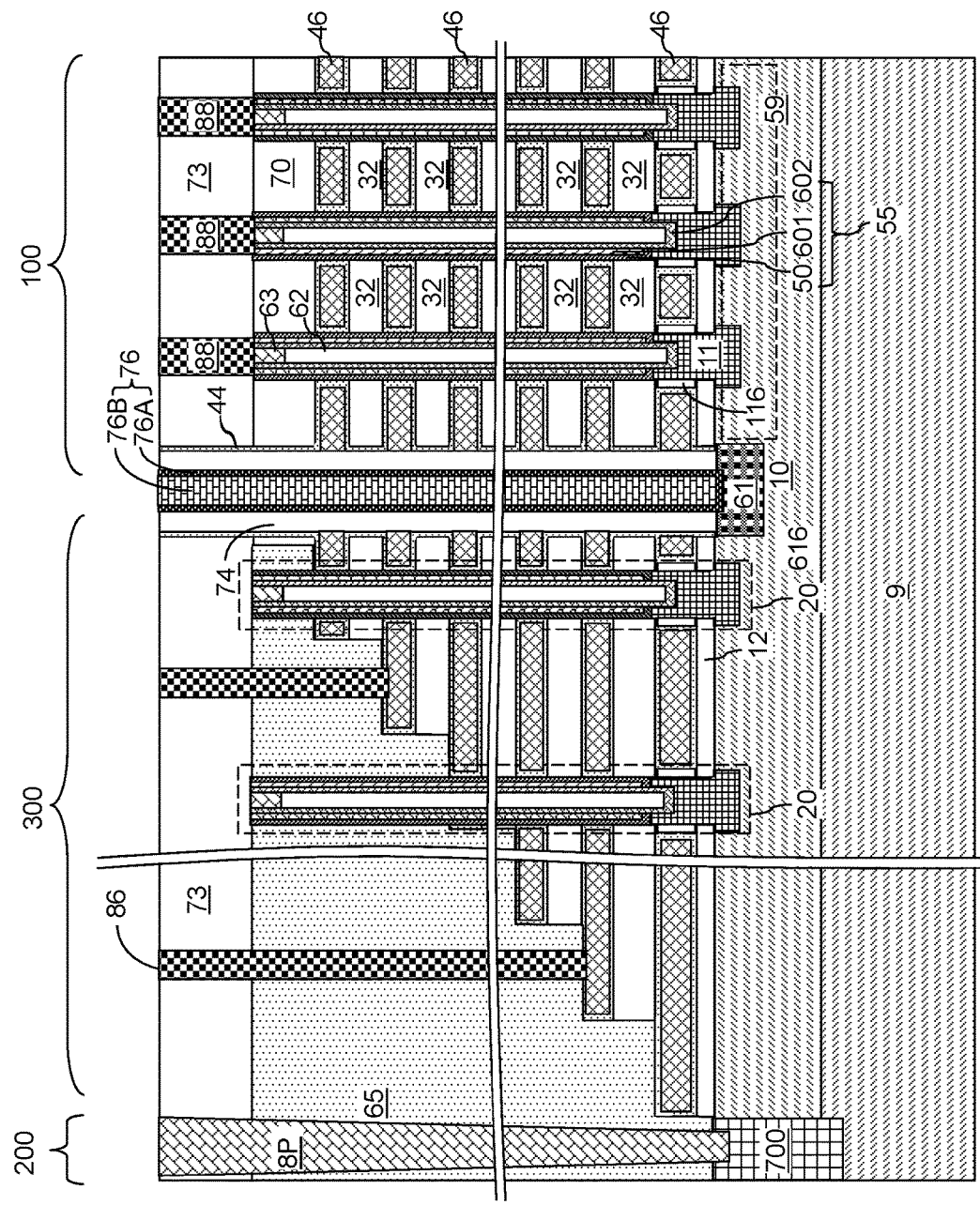
FIG. 13A is a schematic vertical cross-sectional view of the first exemplary structure after formation of additional contact via structures according to the first embodiment of the present disclosure.
Figure 13B:
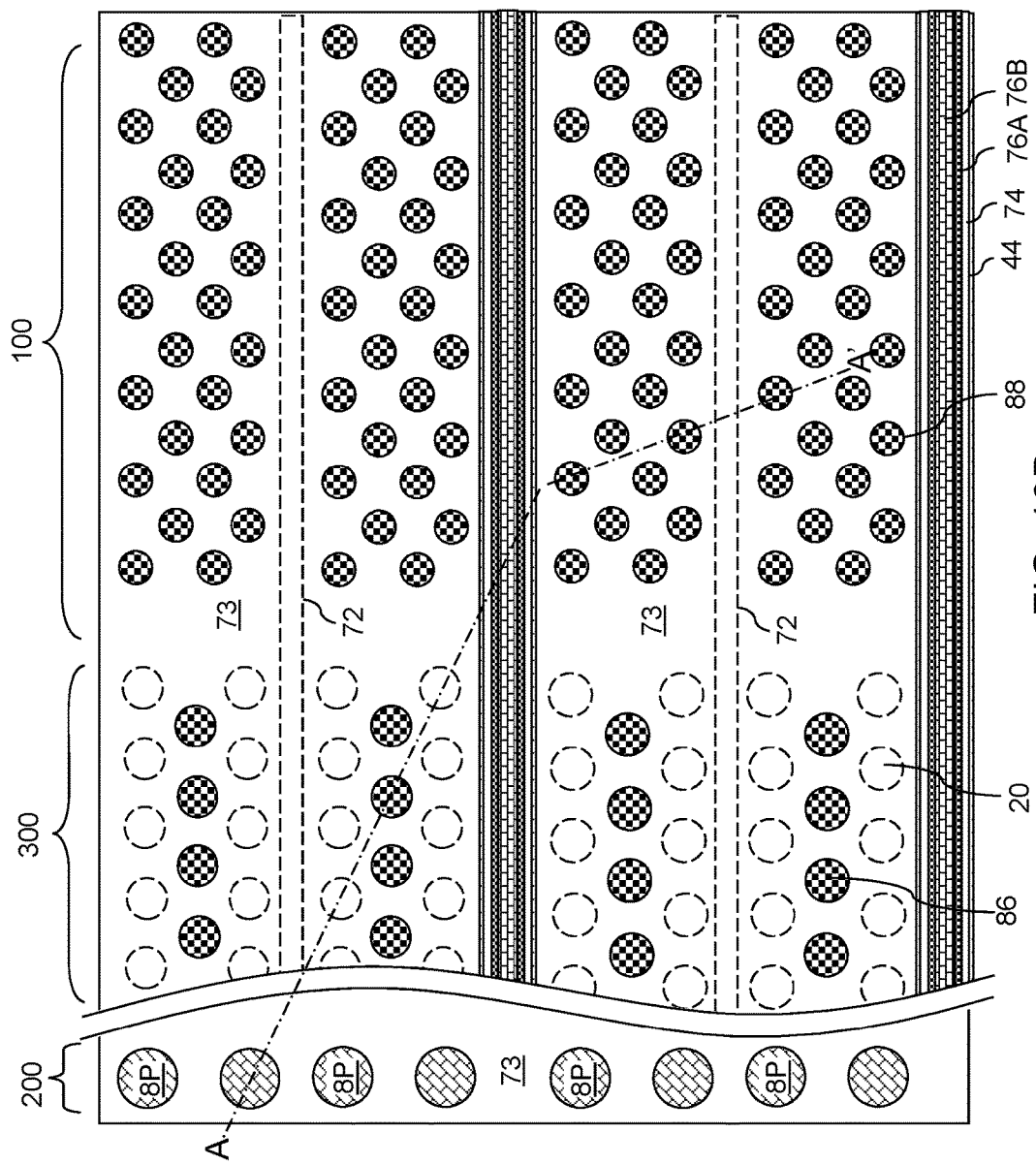
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

According to a second embodiment of the present disclosure, a second exemplary structure can be derived from the first exemplary structure of FIGS. 4A and 4B or a modification thereof by modifying the processing steps employed to form the memory opening fill structures (11, 55, 62, 63) and support pillar structures 20. FIGS. 14A-14E illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 14A, the sacrificial silicon-containing layer 142 of FIG. 5A can be laterally recessed by an isotropic etch that etches the material of the sacrificial silicon-containing layer 42. In one embodiment, an isotropic etch process can be employed which etches the material of the sacrificial silicon-containing layer 142 at a greater etch rate than the material of the semiconductor material layer 10. In one embodiment, the sacrificial silicon-containing layer 142 may include heavily doped and/or amorphous silicon, and an etch process that etches heavily doped and/or amorphous silicon with respect to lightly doped and/or crystalline silicon may be employed to etch the sacrificial silicon-containing layer 142 at a greater etch rate than the semiconductor material layer 10. For example, a trimethyl-2 hydroxyethyl ammonium hydroxide (TMY) solution wet etch may be used to etch the sacrificial silicon-containing layer 142. In one embodiment, the lateral recess distance of the sidewalls of the sacrificial silicon-containing layer 142 with respect to the sidewalls of the insulating layers 32 and the sacrificial material layers 42 around a memory opening 49 may be in a range from 1 nm to 30 nm, such as from 2 nm to 15 nm, although lesser and greater lateral recess distances can also be employed.

Referring to FIG. 14B, an annular silicon oxide spacer 116 is formed around each memory opening 49 at the level of the sacrificial silicon-containing layer 142 by converting a portion of the recessed sacrificial silicon-containing layer 142 into a silicon oxide portion employing an oxidation process. The oxidation process may be the same as the oxidation process at the processing step of FIG. 5B. The duration of the oxidation process is selected such that the entire volume of the annular silicon oxide spacer 116 is located outside the initial memory opening volume of the memory opening 49 (i.e., the volume at the processing steps of FIGS. 4A, 4B, and 5A). In other words, the inner sidewall of each silicon oxide portion (i.e., the annular silicon oxide spacer 116) as formed by the oxidation process has an inner sidewall that is located outside the initial memory opening volume. A front side recess 243 remains adjacent to the annular silicon oxide spacer 116. The front side recess extends into the alternating stack at the level of the sacrificial silicon-containing layer 142 and the annular silicon oxide spacer 116.

A surface portion of the semiconductor material layer 10 is converted into a substrate semiconductor oxide portion 114 during the oxidation process. In one embodiment, the lateral recess distance (i.e. the width of the front side recess 243 in a direction parallel to the top surface of the substrate) of the sidewalls of the annular silicon oxide spacers 116 with respect to the sidewalls of the insulating layers 32 and the sacrificial material layers 42 around each memory opening 49 may be in a range from 1 nm to 30 nm, such as from 2 nm to 15 nm, although lesser and greater lateral recess distances can also be employed. Optionally, the sacrificial silicon-containing layer 142 can include phosphorous-doped polysilicon, and the sacrificial silicon-containing layer 142 can be oxidized at a greater rate than the semiconductor material layer 10. In this case, the lateral thickness of the annular silicon oxide spacer 116 can be greater than the thickness of the substrate semiconductor oxide portion 114.

Referring to FIG. 14C, an etch process can be performed to remove the substrate semiconductor oxide portions 114. The etch process may be an isotropic etch process or an anisotropic etch process. In one embodiment, the etch process can be an anisotropic etch process such as a directional reactive ion etch process employing a plasma. In one embodiment, the substrate semiconductor oxide portions 114 can be completely removed by the anisotropic etch process while the annular silicon oxide spacers 116 are shielded from the plasma of the anisotropic etch process by the alternating stack (32, 42).

Referring to FIG. 14D, a pedestal channel portion 11 can be formed at the bottom portion of each memory opening 49 and each support openings 19 by a selective semiconductor deposition process. For example, the processing step of FIG. 5D can be performed to form the pedestal channel portions 11. In one embodiment, the selective semiconductor deposition process may be a selective epitaxy process. If the semiconductor material layer 10 includes a single crystalline material, each pedestal channel portion 11 comprises a single crystalline semiconductor material in epitaxial alignment with the single crystalline semiconductor material of the semiconductor material layer 10. Alternatively, the semiconductor material layer 10 may be polycrystalline, and the pedestal channel portions 11 may be polycrystalline.

In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of the sacrificial silicon-containing layer 142. In this case, a source select gate electrode can be subsequently formed by subsequently replacing the sacrificial silicon-containing layer 142 with a respective conductive material layer. If a semiconductor material layer 10 is not present, the pedestal channel portion 11 can be formed directly on the substrate semiconductor layer 9, which can have a doping of the first conductivity type.

Figure 14E:
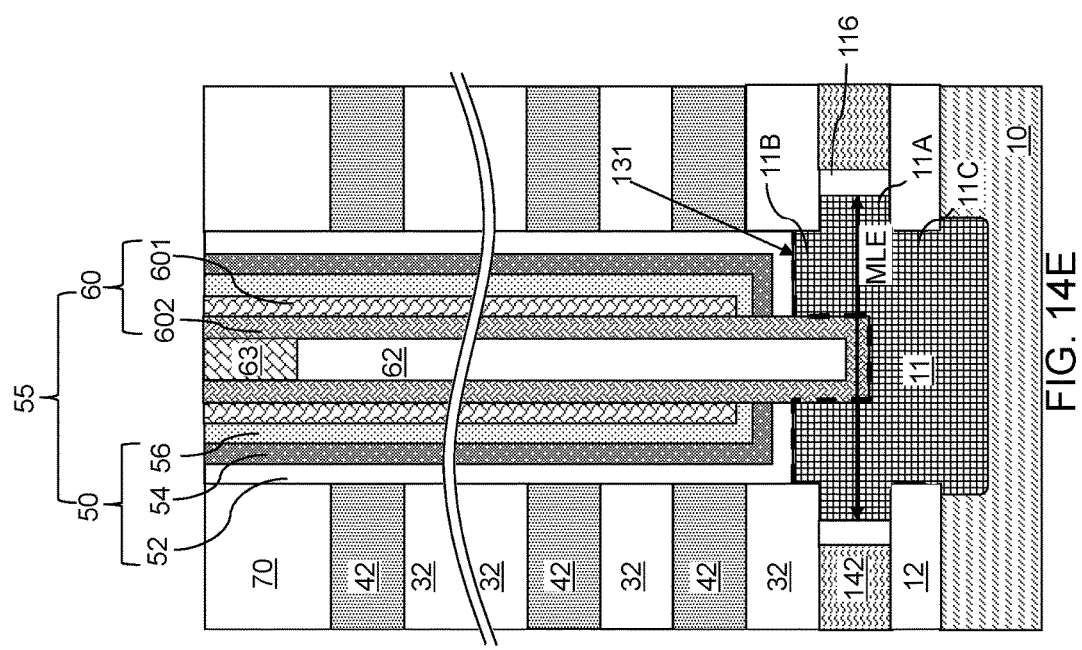

Referring to FIG. 14E, the processing steps of FIGS. 5E-5J can be sequentially performed to form a memory opening fill structure (11, 55, 62, 63) within each memory opening 49 and to form a support pillar structure 20 within each support opening 20.

In one embodiment, the epitaxial channel portion 11 contains a protruding part 11A which is wider than overlying and underlying parts 11B, 11C of the epitaxial channel portion. The protruding part 11A fills the front side recess 243 at the level of the annular silicon oxide spacer 116 (i.e., at the source select gate electrode level), while the overlying and underlying parts 11B, 11C are located at the levels of the insulating layer 32 and the gate dielectric layer 12, respectively. The maximum lateral extent MLE for each epitaxial channel portion 11 can occur in the protruding part 11A for a pair of points located at the vertical interface between the epitaxial channel portion 11 and the annular silicon oxide spacer 116 around each memory opening 49. In one embodiment, the maximum lateral extent MLE for an epitaxial channel portion 11 can be greater than the maximum lateral dimension of the memory opening 49 as originally formed by at least 1 nm, such as by a dimension in a range from 2 nm to 30 nm.

In case the memory openings 49 are formed with vertical sidewalls at the processing steps of FIGS. 4A and 4B, the sidewall of the gate dielectric layer 12 can be vertically coincident with the sidewalls of the alternating stack (32, 42) around the same memory opening 49. In this case, the interface between the gate dielectric layer 12 and the pedestal channel portion 11 can have a maximum lateral dimension that the same as the maximum lateral dimension of the entire interface 131 between the pedestal channel portion 11 and the memory stack structure 55.

The annular silicon oxide spacer 116 contacts, and laterally surrounds, the pedestal channel portion 11 around each memory opening. Around each memory opening 49, the entire inner sidewall of the annular silicon oxide spacer 116 can be located outside a cylindrical vertical plane including a periphery of the entire interface 131 between the pedestal channel portion 11 and the memory stack structure 55.

In one embodiment, the maximum lateral extent MLE of the pedestal channel portion is provided between points within an interface between the annular silicon oxide spacer 116 and the pedestal channel portion 11 as illustrated in FIG. 14E. In this case, the maximum lateral extent MLE of the pedestal channel portion 11 is a lateral separation distance between vertical portions of the interface between the pedestal channel portion 11 and the annular silicon oxide spacer 116.

In one embodiment, the interface between the semiconductor material layer 10 and the pedestal channel portion 11 includes a cylindrical sidewall having a maximum lateral dimension that is greater than the maximum lateral dimension of the entire interface 131 between the pedestal channel portion 11 and the memory stack structure 55. In one embodiment, the maximum lateral extent MLE of the pedestal channel portion 11 can be the maximum lateral dimension of another cylindrical sidewall of the protruding part 11A. In this case, the maximum lateral extent MLE of the pedestal channel portion 11 is provided between a horizontal plane including a top surface of the sacrificial silicon-containing layer 142 and a horizontal plane including a bottom surface of the sacrificial silicon-containing layer 142.

Figure 15:
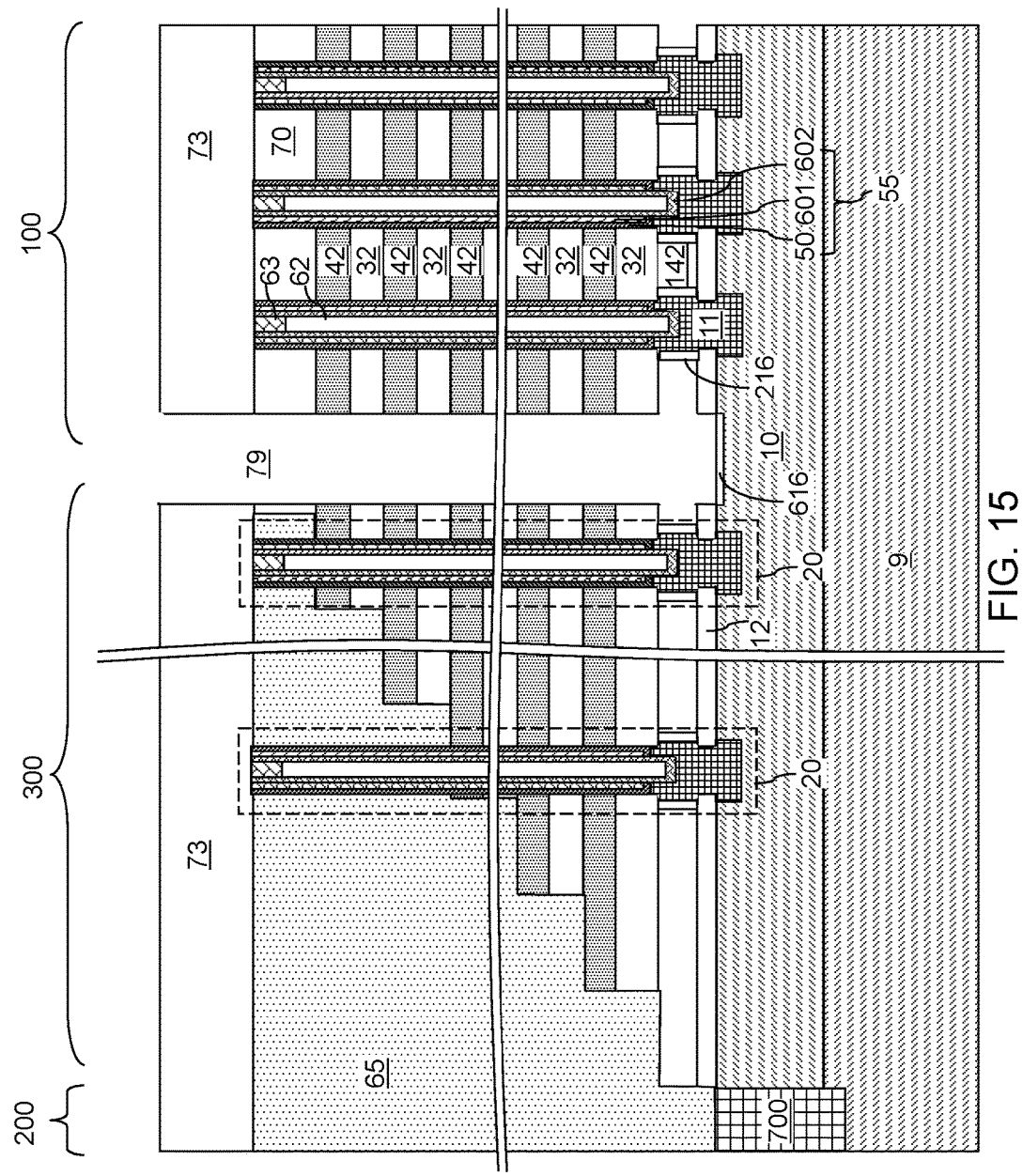
FIG. 15 is a schematic vertical cross-sectional view of the second exemplary structure after formation of backside recesses and source select level backside recesses according to the second embodiment of the present disclosure.

Referring to FIG. 15, the processing steps of FIG. 9 can be performed to form a source select level backside recess 143. If desired, the annular silicon oxide spacer 116 may be selectively removed by selective etching through the source select level backside recess 143 to expose the protruding part 11A of the pedestal channel portion 11. The etch may also remove parts of the bottom insulating layer 32 and gate dielectric layer 12 that were located adjacent to the sacrificial silicon-containing layer 142. If desired, the bottom insulating layer 32 in the alternating stack (32, 142) may be thicker than the other insulating layers 32 in the alternating stack to account for this etching. Likewise, the thickness of the gate dielectric layer 12 may be selected to account for the partial etching of the gate dielectric layer 12 at this step.

The sidewalls of the protruding part 11A of the pedestal channel portion 11 are then reoxidized to form a second annular silicon oxide spacer 216. A surface of the substrate (9, 10) exposed in the backside trench 79 may also be oxidized to form an oxide region 616 at the same time. Alternatively, the annular silicon oxide spacer 116 may be retained in the final device.

Figure 16:
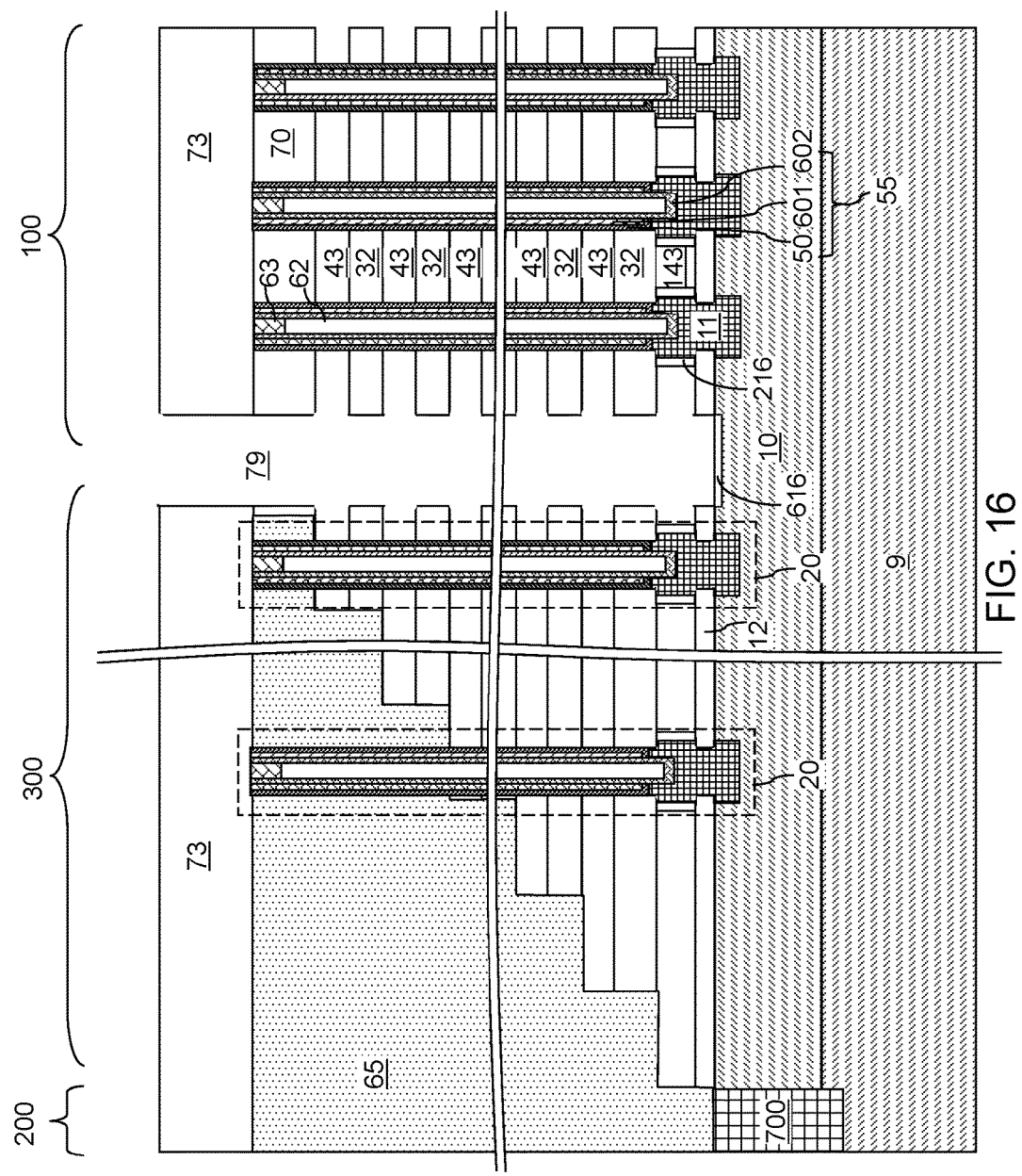
FIG. 16 is a schematic vertical cross-sectional view of the second exemplary structure after formation of tubular dielectric spacers according to the second embodiment of the present disclosure.

Referring to FIG. 16, the processing steps of FIGS. 7A, 7B and 8 can be performed to backside recesses 43. If desired, the order of steps of FIGS. 15 and 16 may be reversed, and the reoxidation to form the second annular silicon oxide spacer 216 can take place after formation of the backside recesses 43.

Figure 17:
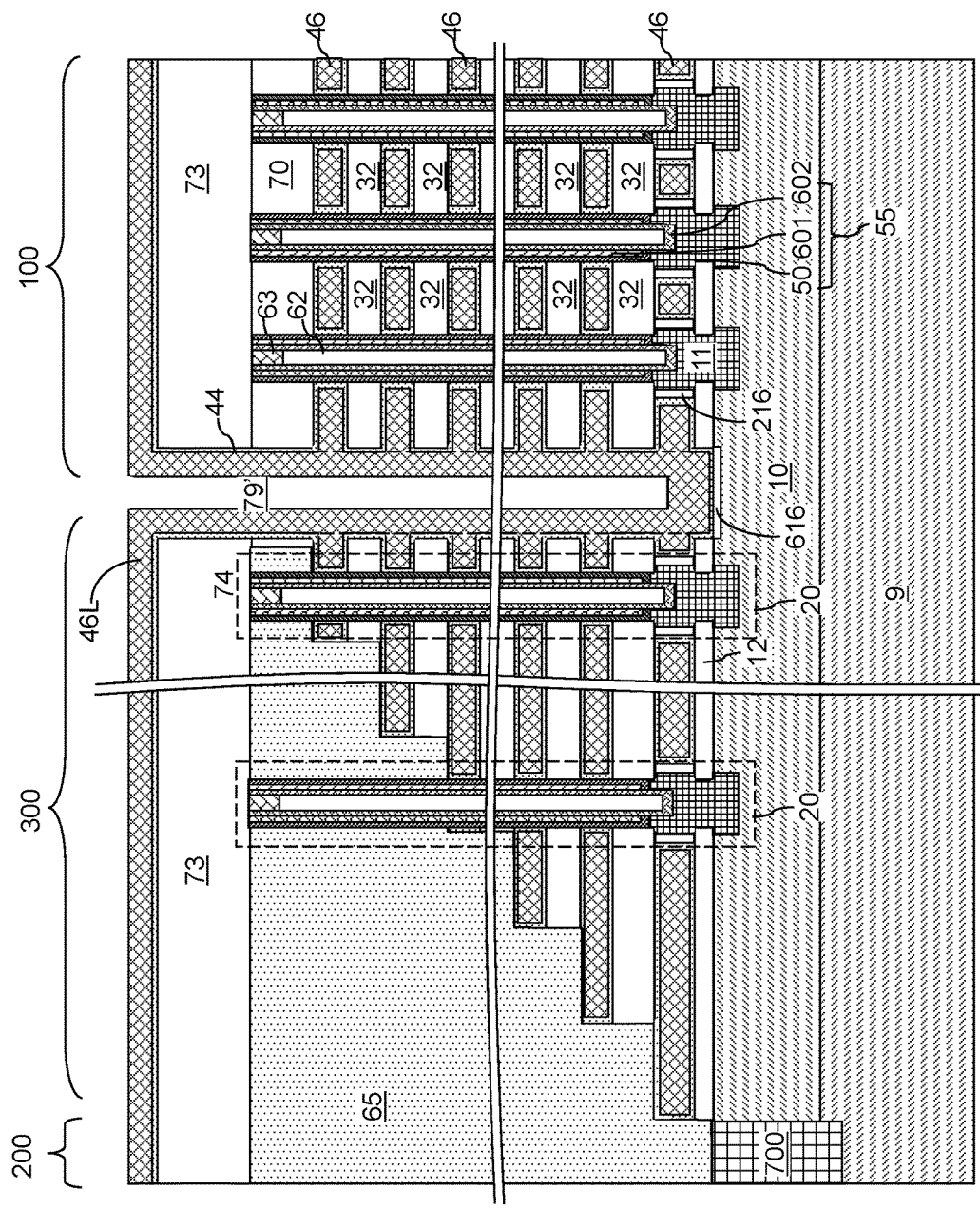
FIG. 17 is a vertical cross-sectional view of the second exemplary structure after formation of electrically conductive layers by deposition of a conductive material according to the second embodiment of the present disclosure.
Figure 18:
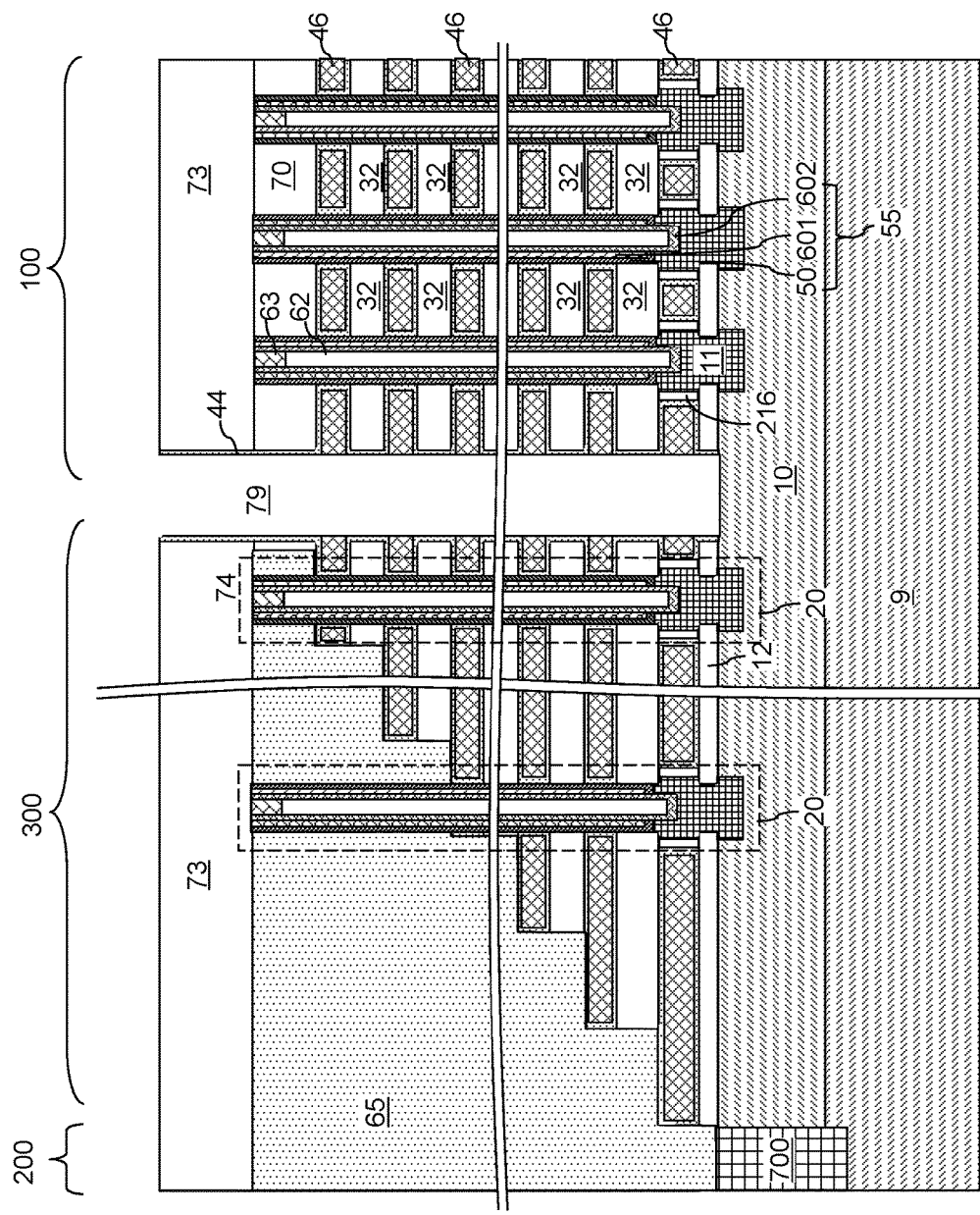
FIG. 18 is a schematic vertical cross-sectional view of the second exemplary structure after removal of a deposited conductive material from within the backside trench according to the second embodiment of the present disclosure.

Referring to FIG. 17, the processing steps of FIG. 10 can be performed to form an optional backside blocking dielectric layer 44, electrically conductive layers 46, and an continuous electrically conductive material layer 46L. Referring to FIG. 18, the processing steps of FIG. 11 can be performed to etch back the continuous electrically conductive material layer 46L.

Figure 19:
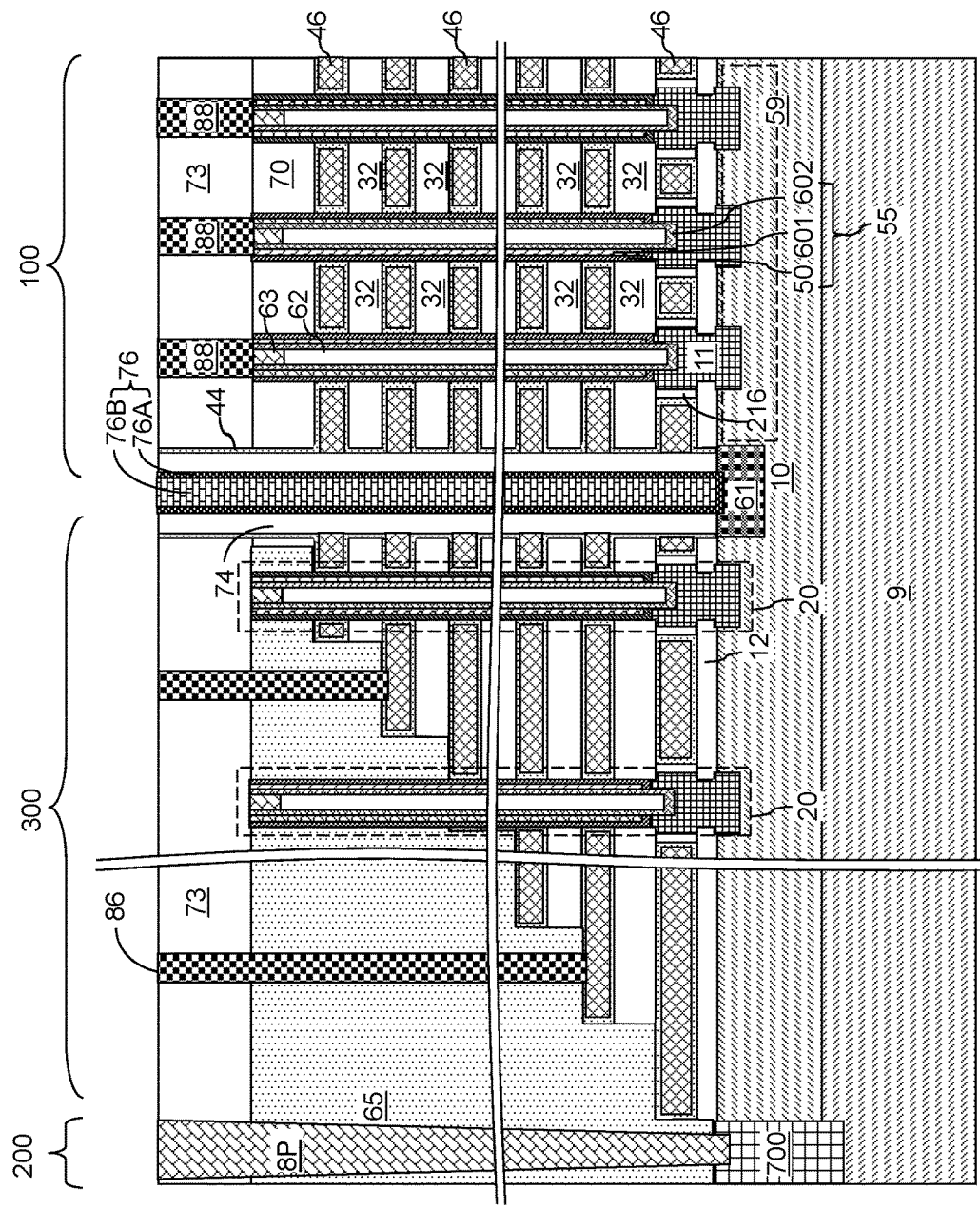
FIG. 19 is a schematic vertical cross-sectional view of the second exemplary structure after formation of insulating spacers, backside contact structures, and additional contact via structures according to the second embodiment of the present disclosure.

Referring to FIG. 19, the processing steps of FIGS. 12, 13A, and 13B can be performed to form insulating spacers 74, source regions 61, backside contact via structures 76, and additional contact via structures (88, 86, 8P). The source regions 61 may also be formed at an earlier step in the process, such as at the steps shown in FIG. 15 or 16.

Figure 20:
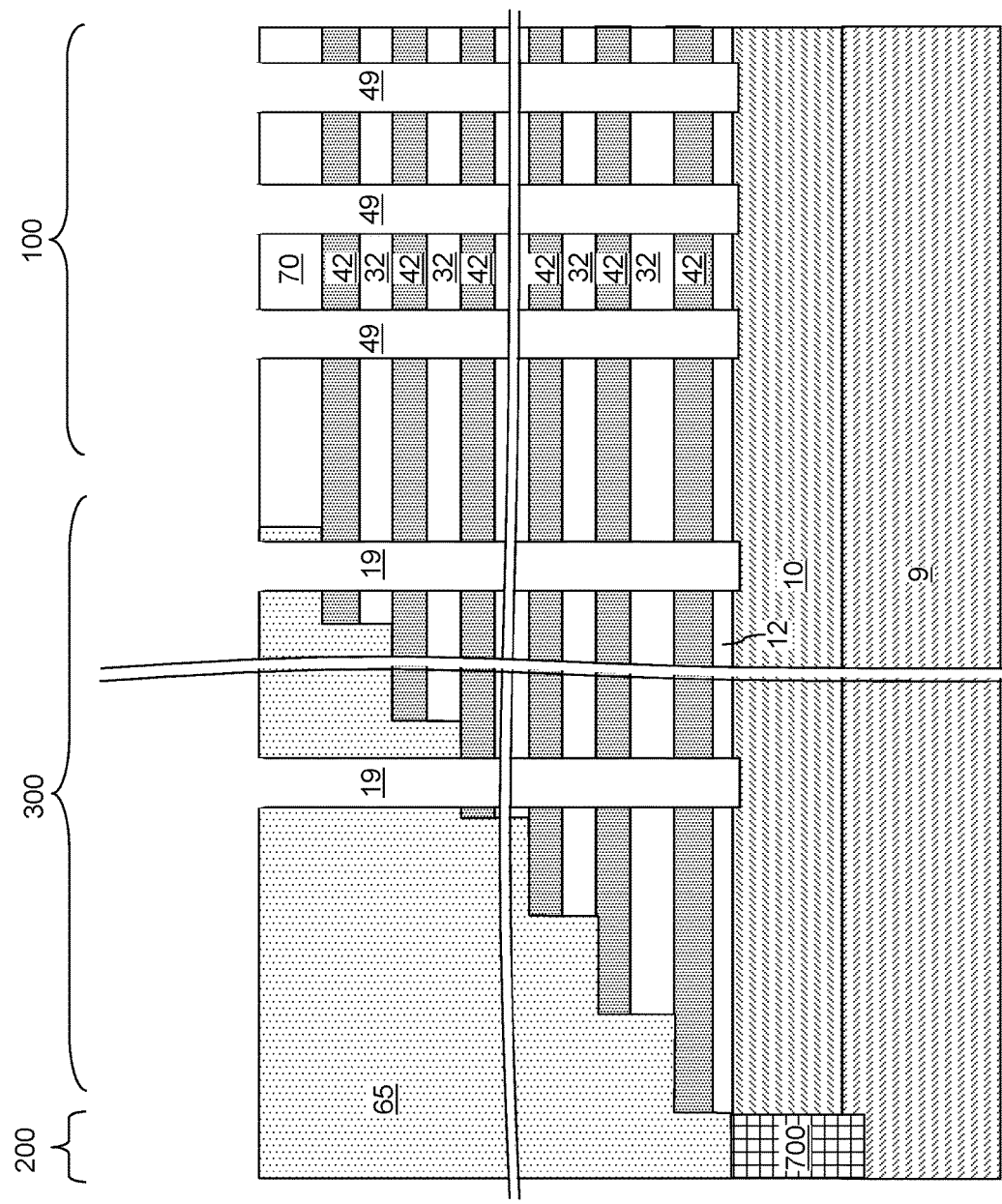
FIG. 20 is a schematic vertical cross-sectional view of a third exemplary structure after formation of memory openings and support openings according to a third embodiment of the present disclosure.

Referring to FIG. 20, a third exemplary structure according to a third embodiment of the present disclosure can be derived from the first exemplary structure of FIGS. 4A and 4B by replacing the sacrificial silicon-containing layer 142 with another sacrificial material layer 42, such as a silicon nitride layer, at a processing step of FIG. 2. Thus, a bottommost sacrificial material layer 42 is formed directly on the gate dielectric layer 12 in the third embodiment.

FIGS. 21A-21H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 21A, a memory opening 49 is illustrated after the processing steps of FIGS. 4A and 4B. The memory opening 49 has an initial memory opening volume. A top surface of the semiconductor material layer 10 is physically exposed at the bottom of the memory opening 49.

Referring to FIG. 2B, a sacrificial pillar structure 111 is formed at the bottom of each memory opening 49 and each support opening 19. The sacrificial pillar structure 111 can be formed by anisotropic deposition of a sacrificial material that can be subsequently removed selective to the alternating stack (32, 42) and the semiconductor material layer 10. For example, the sacrificial material of the sacrificial pillar structures may include amorphous silicon, polysilicon, silicon-germanium, amorphous carbon, diamond-like carbon (DLC), an inorganic polymer such as a silicon-based polymer, or organosilicate glass. Exemplary anisotropic deposition methods include selective semiconductor material CVD on the exposed semiconductor material layer 10, physical vapor deposition (PVD) or vacuum evaporation employing a directional source such as an effusion cell. Additional portions (not shown) of the sacrificial material may be deposited above the insulating cap layer 70. The top surface of the sacrificial pillar structure 111 can contact the sidewall of the bottommost insulating layer 32, which is located between the bottommost sacrificial material layer 42 and the second-from-bottom sacrificial material layer 42.

Referring to FIG. 21C, a sacrificial liner 117 can be formed on the physically exposed sidewalls of the alternating stack (32, 42) and the insulating cap layer 70 by conformal deposition of a sacrificial liner material that is different from the materials of the sacrificial pillar structures 111 and the sacrificial material layers 42, followed by a subsequent anisotropic etch that removes horizontal portions of the sacrificial liner material. The sacrificial liner material can include, for example, silicon oxide. The sacrificial liner material can be deposited by a conformal deposition process such as low pressure chemical vapor deposition (LPCVD). The thickness of the sacrificial liner material can be in a range from 1 nm to 10 nm, such as from 2 nm to 5 nm, although lesser and greater thicknesses can also be employed. The anisotropic etching of the sacrificial liner material can be performed by a reactive ion etch process. Each sacrificial liner 117 can have a cylindrical configuration.

Referring to FIG. 21D, each sacrificial pillar structure 111 can be removed selective to the sacrificial liners 117 from each memory opening 49. If the sacrificial pillar structures 111 include amorphous carbon or diamond-like carbon, the sacrificial pillar structures 111 can be removed by ashing. Alternatively, the sacrificial pillar structures 111 may be removed selective to the sacrificial liners 117 and the semiconductor material layer 10 by an isotropic etch (such as a wet etch) or by an anisotropic etch (such as a reactive ion etch). A sidewall of a bottommost sacrificial material layer 42 is physically exposed around each memory opening 49.

Referring to FIG. 21E, an isotropic etch that etches the material of the bottommost sacrificial material layer 42 selective to the material of the sacrificial liners 117 can be performed. For example, if the sacrificial material layer 42 includes silicon nitride and if the sacrificial liners 117 include silicon oxide, a wet etch employing hot phosphoric acid can be employed to laterally recess the sidewall of the bottommost sacrificial material layer 42 selective to the sacrificial liners 117 to form a front side recess 243. The lateral recess distance may be in a range from 2 nm to 60 nm (such as from 3 nm to 30 nm), although lesser and greater lateral etch distances can also be employed. The remaining sacrificial material layers 42 in the alternating stack are not recessed because they are covered by the sacrificial liners 117.

Referring to FIG. 21F, the sacrificial liners 117 can be removed. In one embodiment, portions of the insulating layers 32 and the gate dielectric layer 12 that are not covered by the sacrificial liners 117 may be collaterally etched. For example, if the insulating layers 32, the gate dielectric layer 12, and the sacrificial liners 117 include silicon oxide, the collateral etch distance for the insulating layers 32 and the gate dielectric layer 12 can be about the same as the thickness of the sacrificial liners 117. Alternatively, the etch can be optimized to obtain substantially vertical sidewalls of layers 12, 32 and 42, as shown by the dashed lines in FIG. 21F. The silicon oxide of the sacrificial liners 117 can be formed by a different method from the silicon oxide of the insulating layers 32 and the gate dielectric layer 12 and/or comprise a doped silicon oxide such that is can be selectively etched compared to sacrificial liners 117 can be formed by a different method from the silicon oxide of the insulating layers 32. A list of different silicon oxide deposition methods and compositions that permit selective etching of one silicon oxide layer over another silicon oxide layer is provided in U.S. Pat. No. 9,305,932, issued on Apr. 5, 2016, which is incorporated herein by reference in its entirety.

Referring to FIG. 21G, a pedestal channel portion 11 can be formed at the bottom portion of each memory opening 49 and each support openings 19 by a selective semiconductor deposition process. For example, the processing step of FIG. 5D can be performed to form the pedestal channel portions 11. The selective semiconductor deposition process grows a semiconductor material from the top surface of the semiconductor material layer 10 while not depositing the semiconductor material from dielectric surfaces. The pedestal channel portion 11 grows within a bottom portion of the initial memory opening volume and outside the initial memory opening volume into the front side recess 243, and contacts the laterally recessed sidewall of the bottommost sacrificial material layer 42. The pedestal channel portion 11 contains a protruding part 11A which protrudes into the front side recess 243. In one embodiment, the selective semiconductor deposition process may be a selective epitaxy process. If the semiconductor material layer 10 includes a single crystalline material, each pedestal channel portion 11 comprises a single crystalline semiconductor material in epitaxial alignment with the single crystalline semiconductor material of the semiconductor material layer 10. Alternatively, the semiconductor material layer 10 may be polycrystalline, and the pedestal channel portions 11 may be polycrystalline.

In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of the bottommost sacrificial material layer 42. In this case, a source select gate electrode can be subsequently formed by subsequently replacing the bottommost sacrificial material layer 42 with a respective conductive material layer. If a semiconductor material layer 10 is not present, the pedestal channel portion 11 can be formed directly on the substrate semiconductor layer 9, which can have a doping of the first conductivity type.

Referring to FIG. 21H, the processing steps of FIGS. 5E-5J can be sequentially performed to form a memory stack structure 55 in a remaining volume of each memory opening 49 and directly on the underlying pedestal channel portion 11. A memory opening fill structure (11, 55, 62, 63) is formed within each memory opening 49, and a support pillar structure 20 is formed within each support opening 19.

Figure 22C:
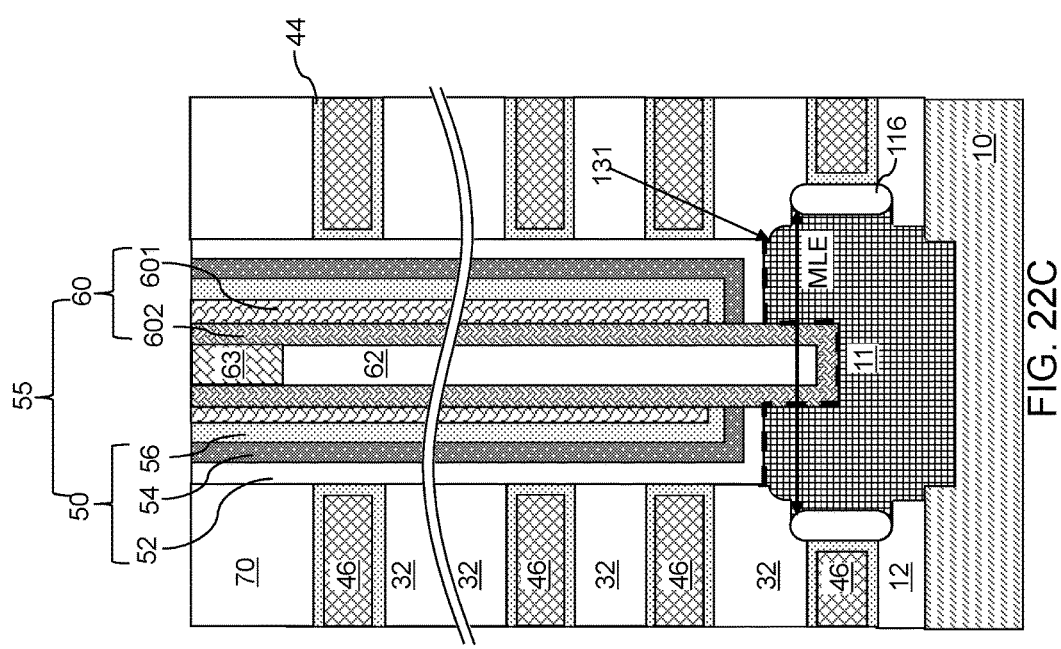

Subsequently, the processing steps of FIGS. 7A, 7B, and 8 can be performed to remove the sacrificial material layers 42 selective to the insulating layers 32, the outermost layer of the memory films 50, and the pedestal channel portions 11. FIGS. 22A-22C illustrate a region around a memory opening within the third exemplary structure during replacement of sacrificial material layers 42 with electrically conductive layers 46.

Referring to FIG. 22A, a region around a memory opening is illustrated at the processing step corresponding to the processing step of FIG. 8, i.e., after removal of the sacrificial material layers 42 and formation of the backside recesses 43. All sacrificial material layers 42 can be removed by an isotropic etch process that is selective to materials of the insulating layers 32, the outermost layer of the memory films 50, and the pedestal channel portions 11.

Referring to FIG. 22B, annular silicon oxide spacers 116 are formed by an oxidation process that oxidizes a surface portion of each pedestal channel portion 11. A thermal oxidation process and/or a plasma oxidation process. The lateral thickness of each annular silicon oxide spacer 116 can be in a range from 2 nm to 40 nm, such as from 3 nm to 20 nm, although lesser and greater thicknesses can also be employed.

Around each memory opening, the annular silicon oxide spacer 116 contacts, and laterally surrounds, the pedestal channel portion 11. The maximum lateral extent MLE of the pedestal channel portion 11 can be provided in the protruding part 11A between points within the interface between the annular silicon oxide spacer 116 and the pedestal channel portion 11. In one embodiment, the maximum lateral extent MLE of the pedestal channel portion 11 can be a lateral separation distance between portions of the interface between the pedestal channel portion 11 and the annular silicon oxide spacer 116. The entire inner sidewall of the annular silicon oxide spacer 116 can be located outside a cylindrical vertical plane including a periphery of the entire interface 131 between the pedestal channel portion 11 and the memory stack structure 55. The interface between the gate dielectric layer 12 and the pedestal channel portion 11 may have a maximum lateral dimension MLDG that is greater than the maximum lateral dimension MLDI of the entire interface 131 between the pedestal channel portion 11 and the memory stack structure 55 due to the collateral recessing of the sidewalls of the gate dielectric layer 12 at the processing steps of FIG. 21F.

Referring to FIG. 22C, the processing steps of FIGS. 10 and 11 can be performed to form electrically conductive layers 46. If the upper portion or the lower portion of the inner sidewall of the annular silicon oxide spacer 116 has a curvature, the maximum lateral extent MLE of the pedestal channel portion 11 can be provided above a horizontal plane including a top surface of the bottommost electrically conductive layer 46 or below a horizontal plane including a bottom surface of the bottommost electrically conductive layer 46. At least the bottommost electrically conductive layer 46 functions as the source select gate electrode, at least the topmost electrically conductive layer 46 functions as the drain select gate electrode, and some or all remaining electrically conductive layers 46 function as word lines/control gate electrodes of vertical NAND strings.

Referring collectively to the various embodiments of the present disclosure, the exemplary structures of the present disclosure can include a three-dimensional memory device. The three-dimensional memory device can include an alternating stack of insulating layers 32 and electrically conductive layers 46 located over a semiconductor surface (e.g., a surface of the semiconductor substrate 9 and/or the semiconductor material layer 10); a memory opening 49 extending through the alternating stack (32, 46); a pedestal channel portion 11 located at a bottom portion of the memory opening 49, comprising a semiconductor material, and contacting a top surface of the semiconductor material layer 11; and a memory stack structure 55 located in the memory opening and contacting a top surface of the pedestal channel portion 11. The memory stack structure 55 comprises a memory film 50 and a vertical semiconductor channel 60 located inside the memory film 50. A maximum lateral extent MLE of the pedestal channel portion 11 is greater than a maximum lateral dimension of an entire interface 131 between the pedestal channel portion 11 and the memory stack structure 55. In one embodiment, the maximum lateral extent MLE of the pedestal channel portion 11 is provided above a horizontal plane including a top surface of the bottommost electrically conductive layer 46 or below a horizontal plane including a bottom surface of the bottommost electrically conductive layer 46 as illustrated in FIGS. 5J and 22C.

In one embodiment, the three-dimensional memory device further comprising an annular silicon oxide spacer 116 contacting, and laterally surrounding, the pedestal channel portion 11, and laterally surrounded by a bottommost electrically conductive layer 46 among the electrically conductive layers 46.

In some embodiments, the maximum lateral extent MLE of the pedestal channel portion 11 may be a lateral separation distance between portions of an interface between the pedestal channel portion 11 and the annular silicon oxide spacer 116 as in the second and third exemplary structures. In one embodiment, the maximum lateral extent MLE of the pedestal channel portion 11 is provided between a horizontal plane including a top surface of the bottommost electrically conductive layer 46 and a horizontal plane including a bottom surface of the bottommost electrically conductive layer 46 as illustrated in the second exemplary structures of FIG. 19 and FIG. 14E.

In some embodiments, the entire inner sidewall of the annular silicon oxide spacer 116 may be located outside a cylindrical vertical plane including a periphery of the entire interface 131 between the pedestal channel portion 11 and the memory stack structure 55 as illustrated in FIGS. 5J, 13A, 14E, 19, and 22C.

In some embodiments, an interface between the semiconductor material layer 10 and the pedestal channel portion 11 includes a cylindrical sidewall having a maximum lateral dimension that is greater than the maximum lateral dimension of the entire interface 131 between the pedestal channel portion 11 and the memory stack structure 55 as illustrated in FIGS. 5J, 13A, 14E, and 19.

In one embodiment, the maximum lateral extent MLE of the pedestal channel portion 11 can be the maximum lateral dimension of the cylindrical sidewall as illustrated in FIGS. 5J and 13A.

In one embodiment, the three-dimensional memory device can further comprise a gate dielectric layer 12 located between the semiconductor material layer 10 and the bottommost electrically conductive layer 46, wherein an interface between the gate dielectric layer 12 and the pedestal channel portion 11 has a maximum lateral dimension that is greater than the maximum lateral dimension of the entire interface 131 between the pedestal channel portion 11 and the memory stack structure 55 as illustrated in FIG. 22C.

In some embodiments, three-dimensional memory device can further comprise a gate dielectric layer 12 located between the semiconductor material layer 10 and the bottommost electrically conductive layer 46, wherein an interface between the gate dielectric layer 12 and the pedestal channel portion 11 has a maximum lateral dimension that the same as the maximum lateral dimension of the entire interface 131 between the pedestal channel portion 11 and the memory stack structure 55 as illustrated in FIGS. 5J, 13A, 14E, and 19.

Each of the exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Cracking or breakage of the pedestal channel portion 11 at a bottom of a memory stack structure 55 in a memory opening 49 through an alternating stack of insulating layers 32 and electrically conductive layers 46 in a three-dimensional memory device can be reduced or eliminated by structurally reinforcing the pedestal channel portion 11 (e.g., by making it wider and/or avoiding over-narrowing it by oxidation).

The structural reinforcement can be provided by forming the annular oxide spacer 116 in the memory opening 49 prior to forming the pedestal channel portion 11. This avoids narrowing the pedestal channel portion 11 by oxidation through the backside recess 143 to form the annular silicon oxide spacer 116, as illustrated in FIGS. 5A-5J. This improves the structural strength of the pedestal channel portion 11.

Alternatively, if the annular silicon oxide spacer 116 is formed by oxidation of the pedestal channel portion 11 through the backside recess 143, then the pedestal channel portion 11 can be made thicker to avoid over-narrowing it during the oxidation. The pedestal channel portion can be made thicker by selectively widening the bottom part of the memory opening 49 followed by growing the thicker pedestal channel portion 11 in the widened bottom part of the memory opening 49, as illustrated in FIGS. 14A-14E and FIGS. 21A-22C.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a semiconductor surface;
   a memory opening extending through the alternating stack;
   a pedestal channel portion located at a bottom portion of the memory opening, comprising a semiconductor material, and contacting a top surface of the semiconductor surface; and
   a memory stack structure located in the memory opening and contacting a top surface of the pedestal channel portion, wherein the memory stack structure comprises a memory film and a vertical semiconductor channel located inside the memory film,
   wherein:
   a maximum lateral extent of the pedestal channel portion is greater than a maximum lateral dimension of an entire interface between the pedestal channel portion and the memory stack structure, the entire interface includes all surfaces at which the pedestal channel portion directly contacts the memory stack structure; and
   the maximum lateral extent of the pedestal channel portion is provided above a horizontal plane including a top surface of the bottommost electrically conductive layer among the electrically conductive layers or below a horizontal plane including a bottom surface of a bottommost electrically conductive layer.

2. The three-dimensional memory device of claim 1, further comprising an annular silicon oxide spacer contacting, and laterally surrounding, the pedestal channel portion, and laterally surrounded by the bottommost electrically conductive layer.

3. The three-dimensional memory device of claim 2, wherein the maximum lateral extent of the pedestal channel portion is a lateral separation distance between portions of an interface between the pedestal channel portion and the annular silicon oxide spacer.

4. The three-dimensional memory device of claim 2, wherein an entire inner sidewall of the annular silicon oxide spacer is located outside a cylindrical vertical plane including a periphery of the entire interface between the pedestal channel portion and the memory stack structure.

5. The three-dimensional memory device of claim 1, wherein an interface between the semiconductor surface and the pedestal channel portion includes a cylindrical sidewall having a maximum lateral dimension that is greater than the maximum lateral dimension of the entire interface between the pedestal channel portion and the memory stack structure.

6. The three-dimensional memory device of claim 5, wherein the maximum lateral extent of the pedestal channel portion is the maximum lateral dimension of the cylindrical sidewall.

7. The three-dimensional memory device of claim 1, further comprising a gate dielectric layer located between the semiconductor surface and the bottommost electrically conductive layer, wherein an interface between the gate dielectric layer and the pedestal channel portion that includes all surfaces at which the gate dielectric layer directly contacts the pedestal channel portion has a maximum lateral dimension that is greater than the maximum lateral dimension of the entire interface between the pedestal channel portion and the memory stack structure.

8. The three-dimensional memory device of claim 1, wherein the semiconductor surface comprises a surface of a substrate or a surface of a semiconductor material layer located over a substrate.

9. The three-dimensional memory device of claim 8, wherein:
   the three-dimensional memory device comprises a monolithic three-dimensional NAND memory device;
   the electrically conductive layers comprise, or are electrically connected to, a respective word line of the monolithic three-dimensional NAND memory device;
   the substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon;
   the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
   the array of monolithic three-dimensional NAND strings comprises:
   a plurality of semiconductor channels, wherein at least one end portion of each of the plurality of semiconductor channels extends substantially perpendicular to a top surface of the substrate, and
   a plurality of charge storage elements, each charge storage element located adjacent to a respective one of the plurality of semiconductor channels.

10. The three-dimensional memory device of claim 1, wherein the entire interface includes:
    an annular horizontal surface at which the memory film directly contacts a topmost surface of the pedestal channel portion;
    a vertical cylindrical surface at which the vertical semiconductor channel directly contacts a cylindrical sidewall of the pedestal channel portion; and
    a horizontal surface at which the vertical semiconductor channel directly contacts a recessed top surface of the pedestal channel portion.

11. The three-dimensional memory device of claim 10, wherein the entire interface consists of the annular horizontal surface, the vertical cylindrical surface, and the horizontal surface.

12. The three-dimensional memory device of claim 10, wherein an entire outer periphery of the annular horizontal surface directly contacts one of the insulating layers that overlie the bottommost electrically conductive layer.

13. The three-dimensional memory device of claim 1, wherein a horizontal surface of the pedestal channel portion contacts a horizontal bottom surface of an insulating layer that overlies the bottommost electrically conductive layer.

14. The three-dimensional memory device of claim 13, wherein a convex surface of the pedestal channel portion contacts a concave surface of the insulating layer that overlies the bottommost electrically conductive layer.

15. The three-dimensional memory device of claim 13, wherein a portion of the gate dielectric layer underlying a peripheral portion of the pedestal channel portion has a lesser vertical thickness than a portion of the gate dielectric layer that underlies the bottommost electrically conductive layer.

16. The three-dimensional memory device of claim 1, wherein a region of the pedestal channel portion directly contacts a portion of the bottom surface of the gate dielectric layer.

17. The three-dimensional memory device of claim 1, wherein a region of the pedestal channel portion directly contacts a portion of the top surface of the gate dielectric layer.

18. The three-dimensional memory device of claim 1, wherein:
   the memory stack structure is located in a memory opening;
   the pedestal channel portion contains a protruding part;
   the maximum lateral extent of the pedestal channel portion is located in the protruding part;
   the maximum lateral extent of the pedestal channel portion is greater than the maximum lateral dimension of the memory opening; and
   the protruding part of the pedestal channel portion laterally protrudes past the memory stack structure located in the memory opening.

* * * * *